United States Patent
Suzuki

(12) 
(10) Patent No.: US 6,459,090 B1
(45) Date of Patent: Oct. 1, 2002

(54) RETICLES FOR CHARGED-PARTICLE-BEAM MICROLITHOGRAPHY THAT EXHIBIT REDUCED WARP AT PATTERN-DEFINING REGIONS, AND SEMICONDUCTOR-DEVICE-FABRICATION METHODS USING SAME

(75) Inventor: Yoshihiko Suzuki, Funabashi (JP)

(73) Assignee: Nikon Corporation, Tokyo (JP)

( * ) Notice: Subject to any disclaimer, the term of this patent is extended or adjusted under 35 U.S.C. 154(b) by 0 days.

(21) Appl. No.: 09/620,764

(22) Filed: Jul. 21, 2000

(30) Foreign Application Priority Data

Jul. 23, 1999 (JP) .......................................... 11-209346
Aug. 31, 1999 (JP) .......................................... 11-245147

(51) Int. Cl.$^7$ .............................................. H01J 37/09
(52) U.S. Cl. ............................... 250/492.23; 250/505.1
(58) Field of Search .................. 250/492.2, 492.22, 250/492.23, 505.1; 430/5, 296

(56) References Cited

U.S. PATENT DOCUMENTS 5,557,110 A * 9/1996 Itoh ..................... 250/492.23
5,756,237 A * 5/1998 Amemiya ..................... 430/5

OTHER PUBLICATIONS

Wolfe et al., "Distortion Analysis of Stencil Masks with Stress–Relief Structures," *J. Vac. Sci. Technol.* 13:2613–2617 (1995).

* cited by examiner

Primary Examiner—Kiet T. Nguyen
(74) *Attorney, Agent, or Firm*—Klarquist Sparkman LLP

(57) ABSTRACT

Reticles and reticle blanks are disclosed for performing charged-particle-beam (CPB) microlithography. The reticles typically include a rigid peripheral frame attached to a reticle portion. Such attachment can cause warping, and thus deformation, of the reticle portion. To reduce such warp, the reticle portion comprises an inner supporting part (surrounding a pattern-defining region) surrounded by an outer supporting part. Situated between the inner and outer supporting parts are multiple connecting structures. The connecting structures can have spring characteristics that collectively absorb warp. Alternatively, the connecting structures can include respective driving mechanisms. The driving mechanisms are especially adapted to cause, when electrically activated, local electrostatic attraction between a respective first conductive region (located on the outer supporting part) and a respective second conductive region (located on the inner supporting part). Selective energization of the connecting structures causes micro movement of inner supporting part (and thus the pattern-defining region) relative to the outer supporting part, thereby canceling reticle warp.

16 Claims, 16 Drawing Sheets

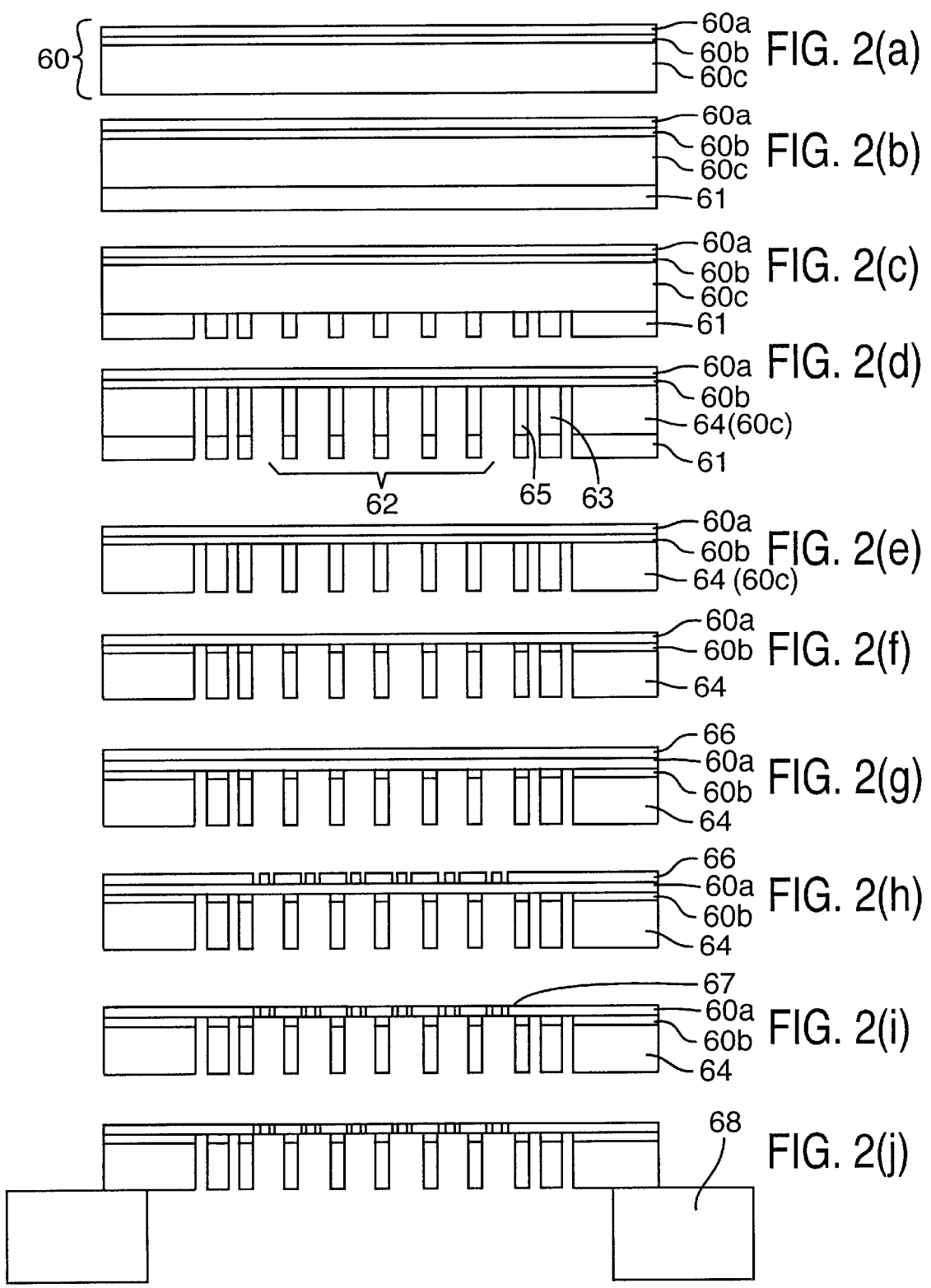

FIG.6(a)
FIG. 6(b)
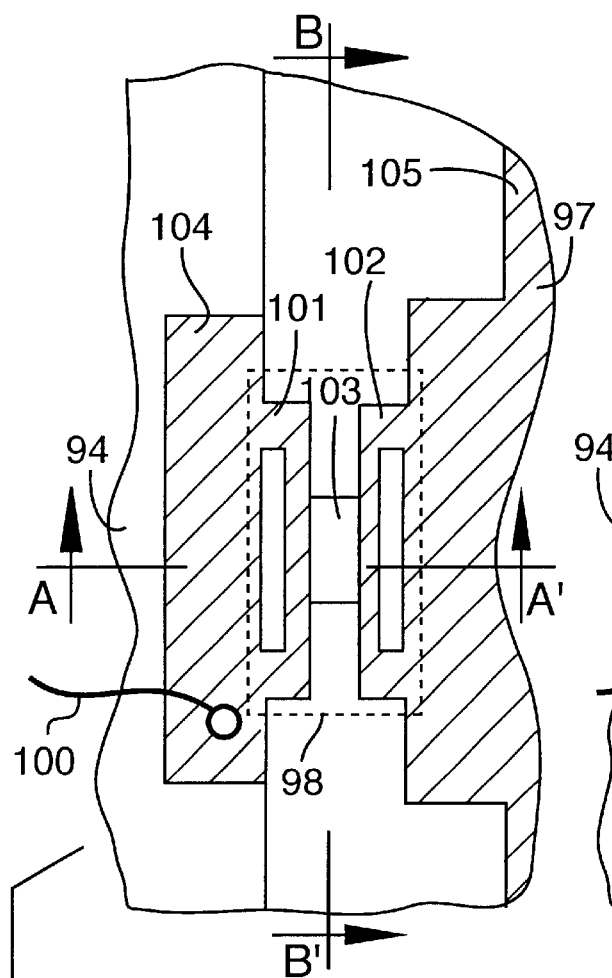
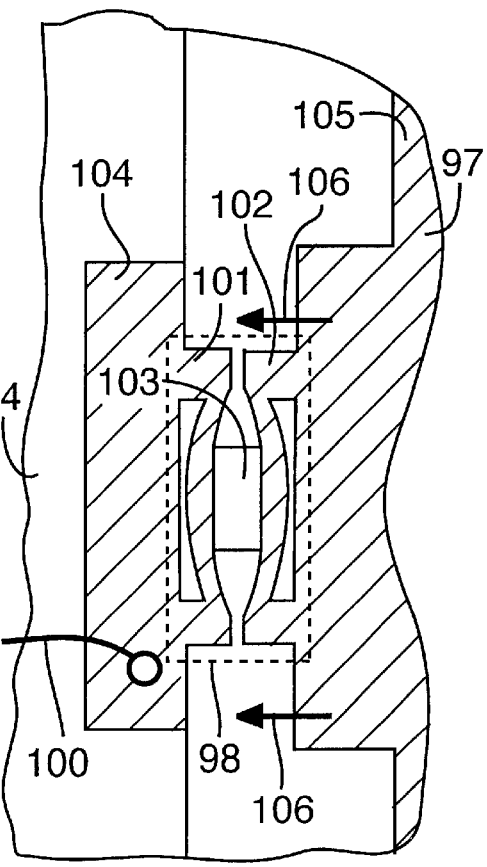
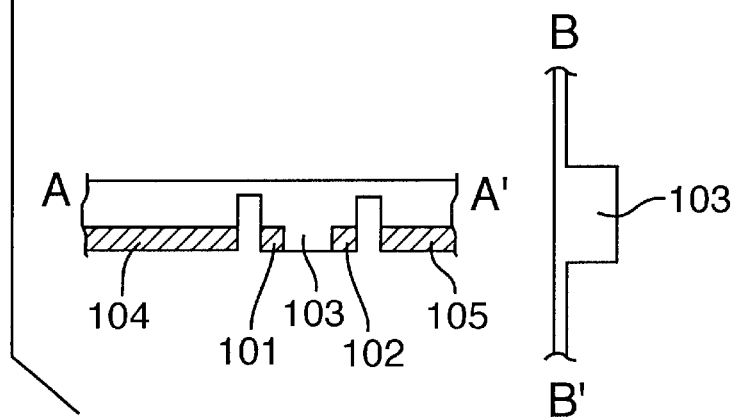

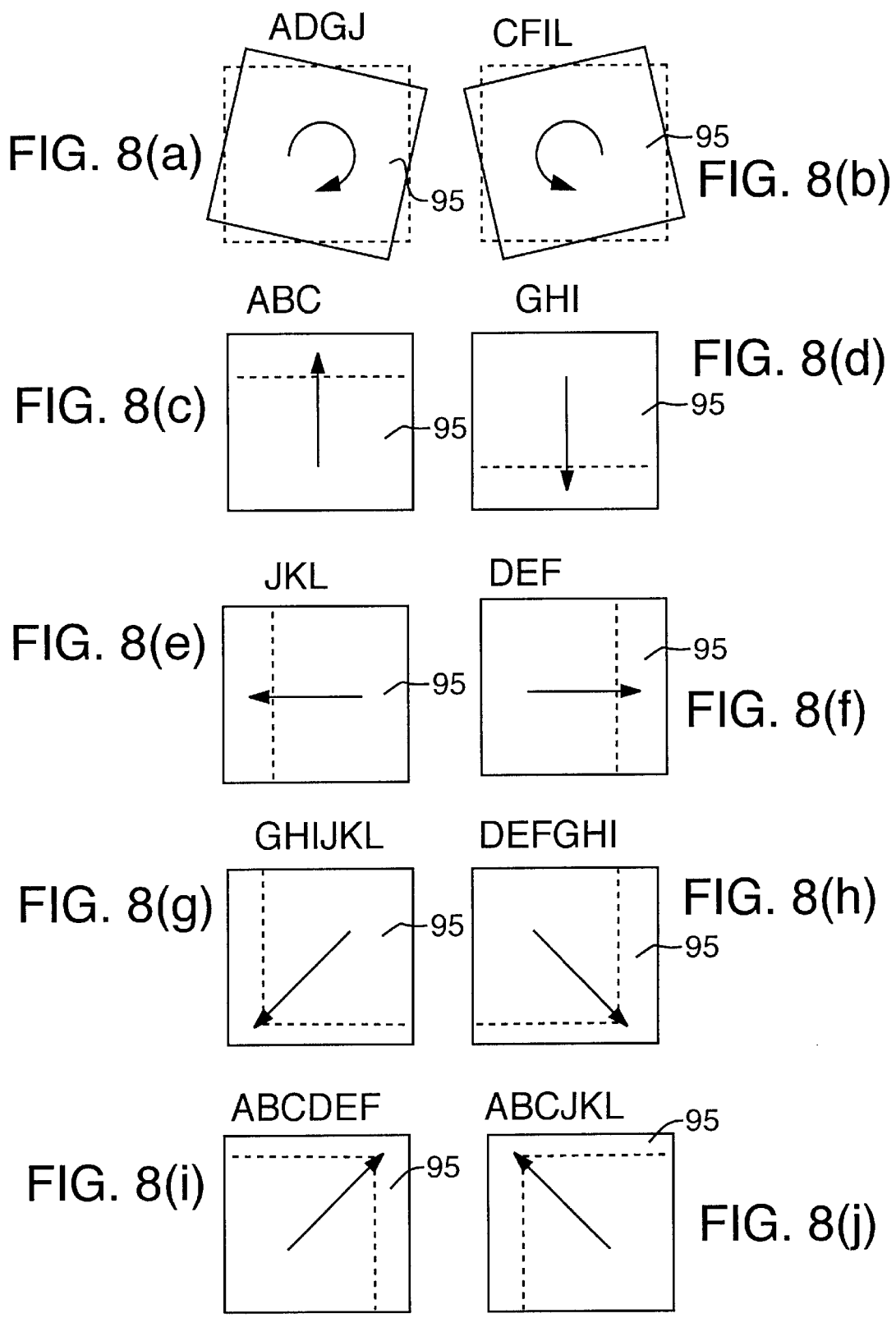

RETICLES FOR CHARGED-PARTICLE-BEAM MICROLITHOGRAPHY THAT EXHIBIT REDUCED WARP AT PATTERN-DEFINING REGIONS, AND SEMICONDUCTOR-DEVICE-FABRICATION METHODS USING SAME

FIELD OF THE INVENTION

This invention pertains to microlithography (projection-transfer of a pattern, defined by a reticle or mask, onto a sensitive substrate such as a semiconductor wafer). Microlithography is a key technology used in the manufacture of semiconductor integrated circuits, displays, and the like. More specifically, the invention pertains to microlithography using a charged particle beam (electron beam or ion beam) as an energy beam. Even more specifically, the invention pertains to methods for making reticles as used in charged-particle-beam (CPB) microlithography, to reticles made using such methods, and to CPB microlithography methods performed using such reticles.

BACKGROUND OF THE INVENTION

In recent years, as semiconductor integrated circuits have become increasingly miniaturized, the resolution limits of optical microlithography (i.e., projection-transfer of a pattern performed using ultraviolet light as an energy beam) have become increasingly apparent. As a result, considerable development effort currently is being expended to develop microlithography methods and apparatus that employ an alternative type of energy beam that offers prospects of better resolution than optical microlithography. For example, considerable effort has been directed to use of X-rays. However, a practical X-ray system has not yet been developed because of many technical problems with that technology. Another candidate microlithography technology utilizes a charged particle beam, such as an electron beam or ion beam, as an energy beam.

A current type of electron-beam pattern-transfer system is an electron-beam system that literally "draws" a pattern on a substrate using an electron beam. In such a system, no reticle is used. Rather, the pattern is drawn line-by-line. These systems can form intricate patterns having features sized at 0.1 $\mu$m or less because, inter alia, the electron beam itself can be focused down to a spot diameter of several nanometers. However, with such systems, the more intricate the pattern, the more focused the electron beam must be in order to draw the pattern satisfactorily. Also, drawing a pattern line-by-line requires large amounts of time; consequently, this technology has very little utility in the mass production of semiconductor wafers where "throughput" (number of wafers processed per unit time) is an important consideration.

In view of the shortcomings in electron-beam drawing systems and methods, charged-particle-beam (CPB) projection-microlithography systems have been proposed in which a reticle defining the desired pattern is irradiated with a charged particle beam. The portion of the beam passing through the irradiated region of the reticle is "reduced" (demagnified) as the image carried by the beam is projected onto a corresponding region of a wafer or other suitable substrate using a projection lens.

The reticle is generally of two types. One type is a scattering-membrane reticle 21 as shown in FIG. 15(a), in which pattern features are defined by scattering bodies 24 formed on a membrane 22 that is relatively transmissive to the beam. A second type is a scattering-stencil reticle 31 as shown in FIG. 15(b), in which pattern features are defined by beam-transmissive through-holes 34 in a particle-scattering membrane 32. The membrane 32 normally is silicon with a thickness of approximately 2 $\mu$m.

Because, from a practical standpoint, an entire reticle pattern cannot be projected simultaneously onto a substrate using a charged particle beam, conventional CPB microlithography reticles are divided or segmented into multiple "subfields" 22a, 32a each defining a respective portion of the overall pattern. The subfields 22a, 32a are separated from one another on the membrane 22, 32 by boundary regions 25, 35, in which no pattern elements are defined. In order to provide the membrane 22, 32 with sufficient mechanical strength and rigidity, support struts 23, 33 extend from the boundary regions 25, 35.

Each subfield 22a, 32a typically measures approximately 1-mm square. The subfields 22a, 32a are arrayed in columns and rows across the reticle 21, 31. For projection-exposure, the subfields 22a, 32a are illuminated in a step-wise or scanning manner by the charged particle beam (serving as an "illumination beam"). As the illumination beam passes through each subfield, the beam becomes "patterned" according to the configuration of pattern elements in the subfield. As depicted in FIG. 15(c), the patterned beam propagates through a projection-optical system (not shown) to the sensitive substrate 27. (By "sensitive" is meant that the substrate is coated on its upstream-facing surface with a material, termed a "resist," that is imprintable with an image of the pattern as projected from the reticle.) The images of the subfields have respective locations on the substrate 27 in which the images are "stitched" together (i.e., situated contiguously) in the proper order to form the entire pattern on the substrate.

Conventionally, reticles of the types summarized above are manufactured using semiconductor-fabrication technology. Fabrication begins with a silicon reticle substrate (typically having a thickness of 1 mm or less). The reticle membrane, subfields, and support struts are fabricated from the reticle substrate. The reticle conventionally is attached circumferentially to a peripheral frame typically having a thickness of about 10 mm. The peripheral frame, normally also made of silicon, strengthens the reticle for routine handling and during use of the reticle in the CPB projection-microlithography apparatus.

A conventional scattering-stencil reticle mounted to a peripheral frame is shown in FIGS. 16(a)–16(b). FIG. 16(a) depicts a reticle assembly 39 comprising a stencil-reticle portion 41 that includes a pattern-defining region 45 and a peripheral region 44. The pattern-defining region 45 includes multiple subfields 42 (each with a respective membrane portion) and support struts 43. The membrane portions have a thickness of about 2 $\mu$m and define respective portions of the reticle pattern, as described above. If the stencil-reticle portion 41 has an outer diameter of about 8 inches, then the thickness of the peripheral region 44 is about 700 $\mu$m. The edge region 46 of the stencil-reticle portion 41 is attached to a peripheral frame 40 having a thickness of about 10 mm.

Unfortunately, with reticles made by conventional technology, attachment of the stencil-reticle portion 41 to a peripheral frame 40 generates a stress throughout the stencil-reticle portion 41 that tends to cause warping (deformation) of the pattern-defining region 45. The warping extends to the subfields 42 and thus to the respective pattern portions defined by the subfields 42. This warping is especially a problem if the stencil-reticle portion 41 is attached to the peripheral frame 40 after the pattern has been formed on the pattern-defining region 45. The warping prevents attainment of sufficiently accurate pattern transfer.

Hence, there is a need for a reticle (for CPB microlithography) that is attached to a peripheral frame 40 but that exhibits substantially reduced warp in the pattern-defining region 45, compared to conventional reticles.

SUMMARY OF THE INVENTION

In view of the shortcomings of the prior art as summarized above, an object of the present invention is to provide reticles in which pattern warp is substantially reduced or reducible.

To such end and according to a first aspect of the invention, reticles are provided, for charged-particle-beam (CPB) microlithography, that comprise a reticle portion. In an embodiment, the reticle portion comprises a pattern-defining region, an inner supporting part, and an outer supporting part. The pattern-defining region comprises multiple subfields separated from one another by support struts. Each subfield defines a respective portion of a pattern defined by the reticle. The inner supporting part is attached peripherally to the pattern-defining region, and is configured to support the pattern-defining region integrally. The outer supporting part surrounds the inner supporting part and is connected to the inner supporting part by multiple connecting structures each having a spring characteristic. The outer supporting part is configured so as to support the inner supporting part and pattern-defining region in a peripheral manner. The reticle can further comprise a peripheral frame peripherally attached to the reticle portion. With such a reticle, stress triggered in the periphery of the reticle as a result, especially, of attaching a peripheral frame to the reticle is absorbed by deformation of the connecting structures rather than warping of the pattern-defining region.

The pattern-defining region can be configured as a stencil reticle in which pattern elements are defined as respective voids in a CPB-scattering reticle membrane. With such a reticle, the temperature of pattern-defining region does not increase excessively during use because the amount of charged-particle absorption by the pattern-defining region is relatively small, even with high illumination-beam currents. Thus, thermally induced warp is reduced. In any event, thermal warp and mechanically engendered warp are dissipated in the connecting structures.

Alternatively, the pattern-defining region can be configured as a scattering-membrane reticle in which pattern elements are defined as respective spaces between CPB-scattering bodies situated on a CPB-transmissive reticle membrane. Even with this type of reticle, temperature increase of the reticle during use is not excessive because the amount of absorption of charged particles by the reticle is small, even at high illumination-beam currents. In any event, thermal warp and mechanically engendered warp are dissipated in the connecting structures.

Each connecting structure can have an H-shaped configuration having two pairs of H-ends. In such a configuration, a first pair of H-ends is connected to the inner supporting part and a second pair of H-ends is connected to the outer supporting part. Alternatively, each connecting structure can have an X-shaped configuration having two pairs of X-ends. In this alternative configuration, a first pair of X-ends is connected to the inner supporting part and a second pair of X-ends is connected to the outer supporting part. With such structures, it is possible to define spring constants by matching the spring constant of connecting structure to a charac- teristic of mechanical strength (especially an elastic characteristic) of the reticle portion.

The reticle can comprise a number (n) of connecting structures each satisfying a relationship $nK_f = K_s/\beta$, wherein $K_s$ is an in-plane elastomeric constant of the reticle portion, $\beta$ is a connection-relaxation coefficient of the connecting structure, and $K_f$ is a spring constant of the connecting structure. With such a configuration, if the number of connecting structures is excessive, then additional mechanical stress is imparted to the reticle portion, which is rendered easily warped. On the other hand, if the number of connecting structures is too low, then proper support of the reticle portion becomes too difficult to achieve. By satisfying this relationship, the reticle portion is supported adequately while inhibiting propagation of warp from the outer supporting part to the inner supporting part (and pattern-defining region).

According to another aspect of the invention, methods are provided for making a reticle for CPB microlithography. Inc an embodiment of such methods, a silicon-on-insulator (SOI) reticle substrate is provided. The reticle substrate comprises a base layer, a silicon oxide layer on an obverse surface of the base layer, and a silicon layer on the silicon oxide layer. An etching mask is applied to a reverse surface of the base layer. The etching mask defines respective openings at anticipated locations of reticle subfields in a patter-defining region. The etching mask also defines respective locations of an inner supporting part surrounding the pattern-defining region, an outer supporting part surrounding the inner supporting part, and multiple connecting structures connecting the inner supporting part to the outer supporting part. The base layer is etched anisotropically at openings in the etching mask. The etching is allowed to proceed depthwise through the base layer to the silicon oxide layer, so as to define the subfields, the inner supporting part, the outer supporting part, and the connecting structures. Afterward, the exposed regions of silicon oxide are removed. Desirably, each connecting structure is composed of silicon and is formed in the anisotropic etching step by selectively etching away complementary regions of the base layer by anisotropic etching. The connecting structures can be formed, in the anisotropic etching step, at the same time as supporting struts separating the subfields from each other in the pattern-defining region. By fabricating the connecting structures at the same time as the support struts, the time (and cost), required to fabricate the reticle is reduced.

The method summarized above can include the step of defining a chip pattern in the pattern-defining region, and/or the step of attaching a peripheral frame to the outer supporting part.

According to another aspect of the invention, CPB microlithography reticles are provided that are formed by any of the methods according to the invention.

According to another embodiment, CPB-microlithography reticles according to the invention comprise a reticle portion that comprises (1) a:pattern-defining region comprising multiple subfields separated from one another by support struts, wherein each subfield defines a respective portion of a pattern defined by the reticle; (2) an inner supporting part peripherally attached to the pattern-defining region and configured so as to integrally support the pattern-defining region; (3) an outer supporting part peripherally surrounding the inner supporting part; and (4) multiple connecting structures connecting the inner supporting part to the outer supporting part. Each connecting structure comprises a first conductive region situated on the outer supporting part and a second conductive region situated on the inner supporting part. At least the first conductive regions are selectively energizable electrically so as to cause, in a selective manner, the respective first and second conductive regions to move relative to each other, thereby displacing the pattern-defining region so as to cancel, at least partially, a warp of the patter-defining region.

In each connecting structure, the first and second conductive regions can exhibit an electrostatic attraction with respect to each other under appropriate conditions of electrical energization of at least the respective first conductive region.

The reticles can further comprise a peripheral frame peripherally attached to the outer supporting part. In such a configuration, the peripheral frame can comprise a conductive pad from which a wiring connection is made to a respective first conductive region.

Each of the first conductive regions can comprise a first flexible membrane member connected to the outer supporting part. Similarly, each of the second conductive regions can comprise a second flexible membrane member connected to the inner supporting part. In such a configuration, each connecting structure desirably further comprises an insulating member situated between the respective first and second flexible membrane members.

According to another aspect of the invention, CPB microlithography apparatus are provided. An embodiment of such an apparatus comprises an illumination-optical system, a projection-optical system, a reticle stage, and a substrate stage. The illumination-optical system is situated and configured to irradiate a charged-particle illumination beam onto a selected region of any of the various embodiments of a reticle, according to the invention, as summarized above. The reticle stage is situated and configured to: (i) hold the reticle as the reticle is being illuminated by the illumination beam, and (ii) selectively energize the conductive regions so as to reduce reticle warp. The projection-optical system is situated and configured to receive a patterned beam, formed by passage of the illumination beam through the reticle and carrying an image of the irradiated region of the reticle, and to focus the image onto a predetermined position on a sensitive substrate. The substrate stage is situated and configured to hold the substrate as the substrate is being exposed by the patterned beam.

According to yet another aspect of the invention, methods are provided for microlithographically exposing a pattern onto a sensitive substrate using a charged particle beam. In an embodiment of such a method, a reticle is provided that comprises: (i) a pattern-defining region comprising multiple subfields each defining a respective portion of a pattern defined by the reticle, (ii) an inner supporting part peripherally attached to the pattern-defining region and configured so as to support the pattern-defining region integrally, (iii) an outer supporting part peripherally surrounding the inner supporting part, and (iv) multiple connecting structures connecting the inner supporting part to the outer supporting part. Each connecting structure comprises a first conductive region situated on the outer supporting part and a second conductive region situated on the inner supporting part. At least one of the conductive regions is energized electrically in a selective manner so as to cause, in a selective manner, the respective first and second conductive regions to move relative to each other, thereby displacing the pattern-defining region so as to cancel, at least:partially, a warp of the pattern-defining region. The charged particle beam is irradiated selectively onto the subfields in an ordered manner to transfer the reticle pattern to the substrate.

The foregoing and additional features and advantages of the invention will be more readily apparent from the following detailed description, which proceeds with reference to the accompanying drawings.

BRIEF DESCRIPTION OF THE DRAWINGS

FIGS. 2(a)–2(j) are elevational views of the results of certain respective steps of a method, according to the invention, for manufacturing a reticle of the first representative embodiment.

FIGS. 6(a)–6(b) depict certain details of a drivable connecting structure in a reticle as shown in FIG. 5(a). FIG. 6(a) includes two sections, one along the line A–A' and the other along the line B–B', providing further detail of the connecting structure.

FIGS. 8(a)–8(j) schematically depict respective modes of motion of the pattern-defining region of a reticle according to the third representative embodiment whenever certain indicated drivable connecting structures are actuated.

FIG. 9(a) shows a plan view and elevational section along the line X–X', and FIG. 9(b) shows a plan view and elevational section along the line Y–Y'.

FIG. 10(a) shows an elevational section only, and FIG. 10(b) shows both a plan view and an elevational section along the line Z–Z'.

FIGS. 16(a)–16(b) depict certain aspects of a conventional scattering-stencil reticle, for charged-particle-beam microlithography, incorporating a peripheral frame.

DETAILED DESCRIPTION

The following description is directed to scattering-stencil reticles, as exemplary reticles, according to the invention, for charged-particle-beam (CPB) microlithography. It will be understood, however, that embodiments of the invention are not limited to scattering-stencil reticles. The principles described below can be applied with equal facility to other types of reticles for CPB microlithography, such as scattering-membrane reticles.

The invention is described below in the context of representative embodiments. However, it will be understood that the invention is not limited to those embodiments.

FIRST REPRESENTATIVE EMBODIMENT

Figure 1A:
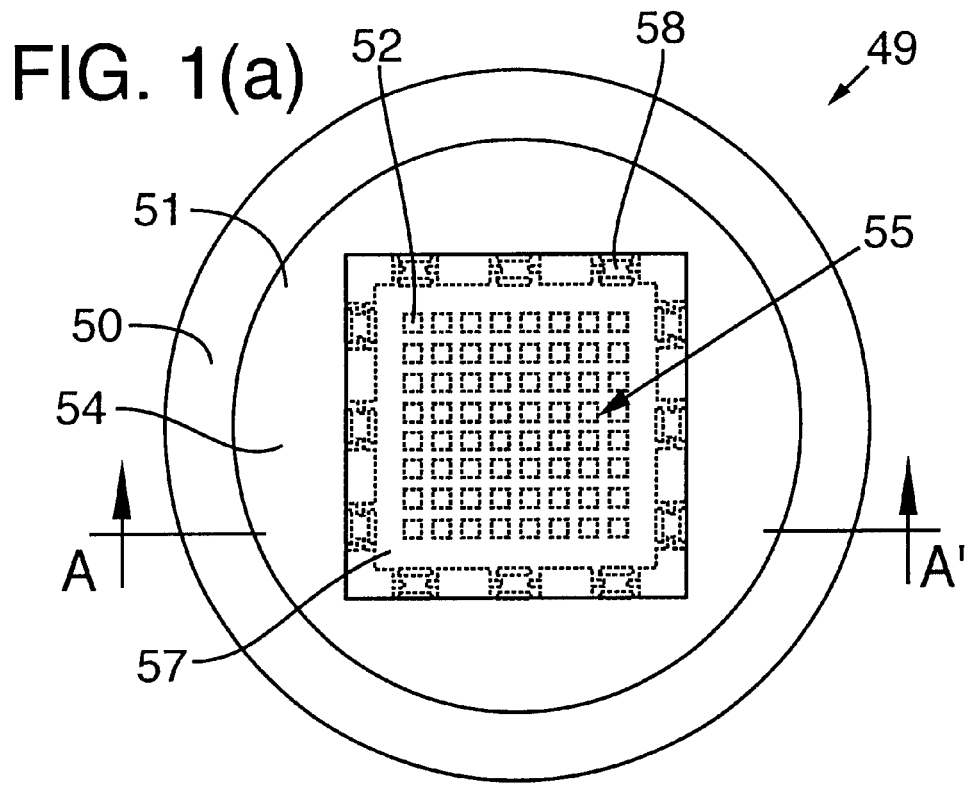
FIGS. 1(a)–1(b) are an obverse plan view and elevational section (along the line A—A), respectively, of a reticle according to a first representative embodiment of the invention.
Figure 1B:
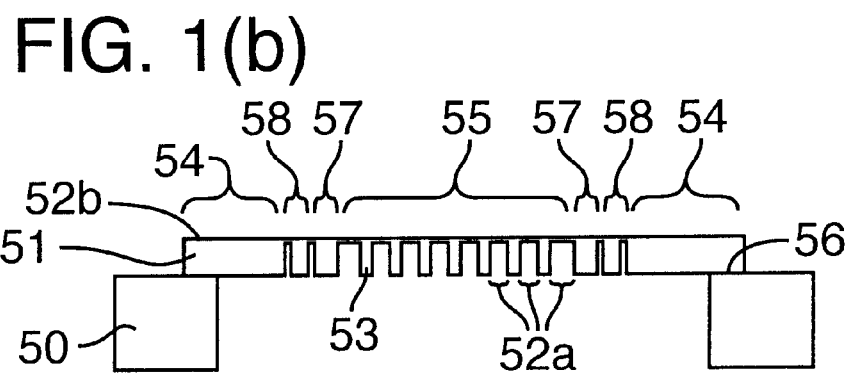

A reticle 49 according to this embodiment is shown in FIGS. 1(a)–1(b), and comprises a stencil-reticle portion 51 and a peripheral frame 50. The stencil-reticle portion 51 comprises an outer supporting part 54, an inner supporting part 57, a pattern-defining region 55, and multiple connecting structures 58 for connecting together the outer supporting part 54 and the inner supporting part 57. The pattern-defining region 55 is divided into multiple subfields 52a separated from one another by support struts 53. Each subfield 52a includes a respective portion of the reticle membrane 52b. The peripheral frame 50 is attached to the edge region 56 of the stencil-reticle portion 51.

The reticle 49 can be fabricated using semiconductor-fabrication technology. FIGS. 2(a)–2(j) schematically depict the results of certain respective steps in a fabrication process for making the reticle 49. In a first step (FIG. 2(a)), a silicon.-on-oxide (SOI) reticle substrate 60 is prepared. By way of example, the reticle substrate 60 has an outer diameter of 8 inches and a thickness of 725 μm. The reticle substrate 60 includes a base layer 60c, a silicon oxide layer 60b, and a silicon layer 60a. The silicon layer 60a has a thickness of approximately 2 μm and normally comprises doped silicon. The silicon oxide layer 60b has a thickness of approximately 1 μm and serves as an intermediate layer. The base layer, 60c is made of silicon. A layer 61 of an organic resist is formed on the reverse side of the base, layer 60c (FIG. 2(b)), followed by patterning of the resist 61 (FIG. 2(c)). Material of the base layer 60c is removed selectively by dry etching, in the depthwise direction, from the regions unprotected by the resist 61 (FIG. 2(d)). In other words, the patterned resist 61 serves as an etching mask. As shown in FIG. 2(d), depthwise etching stops automatically at the silicon oxide layer 60b. The dry etching defines subfields 62, support struts 65, and the inner supporting part 63. Next, the remaining resist 61 is removed (FIG. 2(e)), and the exposed regions of the silicon oxide 60b are removed (FIG. 2(f)) using hydrogen fluoride or other suitable reagent. Thus, the silicon layer 60a becomes a reticle membrane. Next, a layer of an organic resist 66 is coated on the upper surface of the SOI substrate 60 (specifically on the upper surface of the silicon layer 60a, FIG. 2(g)), and a desired stencil pattern is imprinted in the resist 66 (FIG. 2(h)). Using the remaining resist 66 as an etching mask, a reticle stencil pattern 67 is formed in the silicon layer 60a, and the remaining resist 66 is removed (FIG. 2(i)). Finally, a peripheral frame 68, made of a material such as silicon, ceramic, or glass, is attached peripherally to the stencil-reticle portion (FIG. 2(j)), desirably using an adhesive, or by anodic welding or eutectic welding.

In the method of FIGS. 2(a)–2(j), connecting structures (see item 58 in FIG. 1(a)) can be formed at the same time as the support struts 65. Alternatively, the connecting structures 58 can be formed independently of the struts 65. Also, the connecting structures 58 can be formed so as to be surrounded by thin membrane regions as shown in FIG. 1(b), or to be surrounded by through-holes (represented by regions 75a and 75b in FIG. 3(a)).

In a CPB microlithographic reticle fabricated as described above, attachment of the peripheral frame 50 (FIG. 1(a)) to the outer supporting part 54 can generate a warp that is transmitted to the inner supporting part 57 and the pattern-defining region 55. To achieve a substantial reduction (e.g., ten-fold) in warp transmitted to the pattern-defining region 55 each connecting structure 58 desirably is configured to have a spring constant that is approximately one tenth the spring constant of the combined inner supporting part 57 and pattern-defining region 55.

For example, consider a warp of 100 nm arising by connecting the peripheral frame 50 to the stencil-reticle portion 51. This warp at the pattern-defining region 55 can be reduced to 10 nm by using a reticle 49 configured according to this embodiment. More specifically, the spring constant of a connecting structure 58 can be defined from the size of the pattern-defining region 55, the number of support struts 53, the width of each support strut 53, and the spacing between the support struts 53. In general, the stated 10-fold reduction in warp transmission to the pattern-defining region 55 is achieved by employing at least ten to less than 20 connecting structures 58, each having a spring constant of about 1 N/μm between the inner supporting part 57 and the outer supporting part 54. More accurately, if the in-plane elastic constant of the stencil-reticle portion 51 is denoted as $K_s$, the connection-relaxation coefficient is denoted as $\beta$, and the spring constant of the connecting structure 58 is denoted as $K_f$, then the number "n" of connecting structures 58 and their spring constants can be configured to satisfy the relation: $nK_f=K_s/\beta$.

Figure 3A:
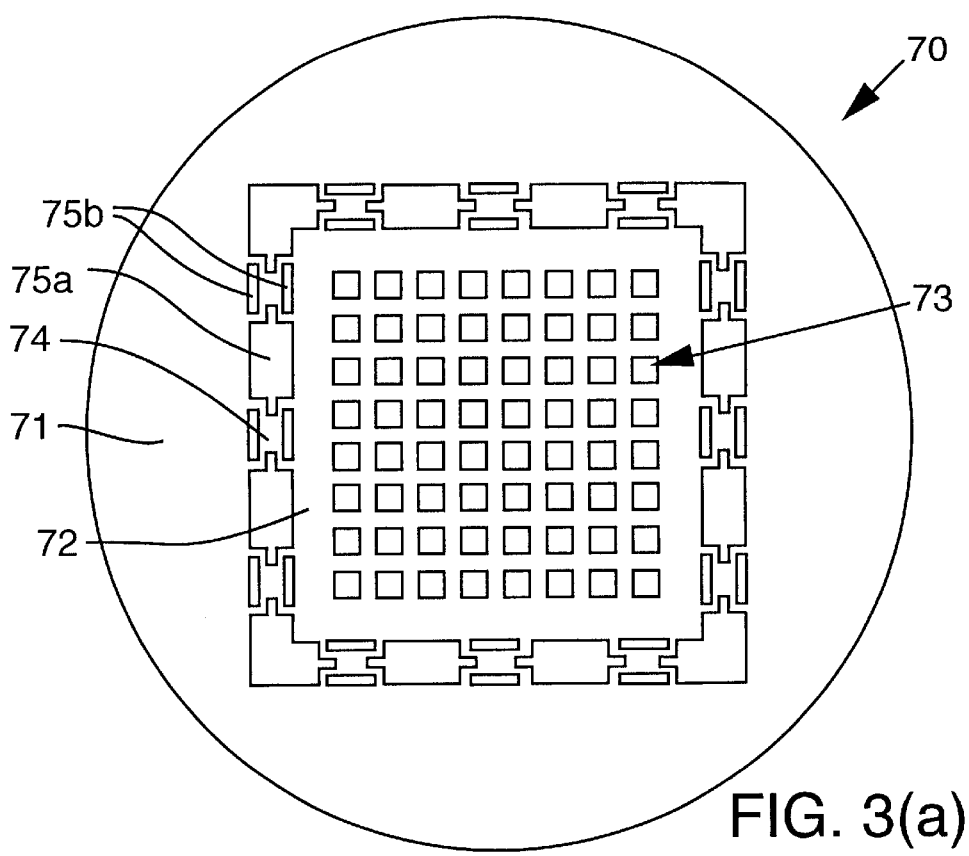
FIG. 3(a) is a reverse plan view of a portion of the reticle of the first representative embodiment.
Figure 3B:
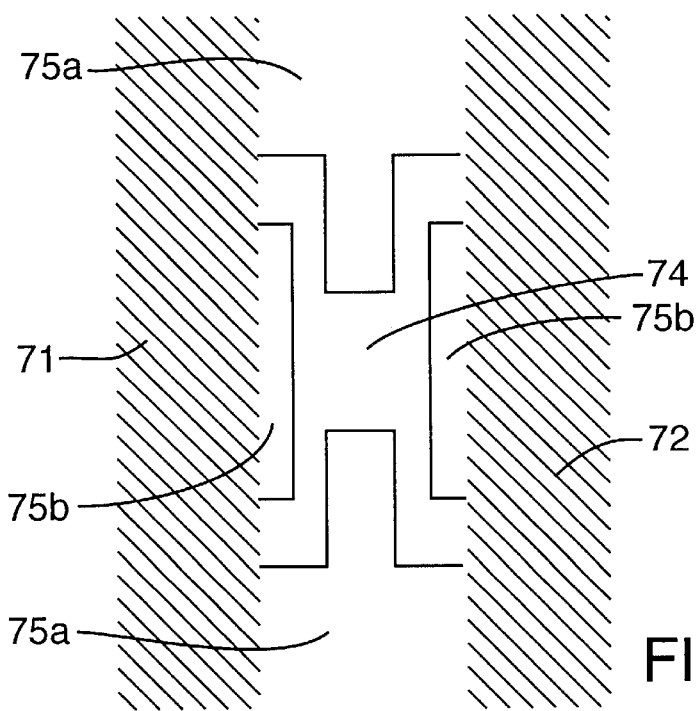
FIG. 3(b) is a plan view of certain details of a connecting structure in the reticle of FIG. 3(a).

FIGS. 3(a)–3(b) show a stencil-reticle portion 70 that can be produced using the method described above and shown in FIGS. 2(a)–2(j). The stencil-reticle portion 70 includes an outer supporting part 71, an inner supporting part 72, and a pattern-defining region 73 (comprising multiple subfields separated from one another by support struts). The inner supporting part 72 is connected to the outer supporting part via multiple connecting structures 74 (see detail in FIG. 3(b)). The pattern-defining region 73 is supported by the struts and by the inner supporting part 72.

Although the connecting structures 74 of this embodiment have the simple configuration shown in FIG. 3(b), the configuration of the connecting structures 74 is not so limited. In general, to facilitate adjustment of the spring constant, it is desirable that, at the location of each connecting structure, the inner supporting part 72 and the outer supporting part 71 each have two connections. With such a configuration, the connecting structure 74 has an "H" configuration (FIG. 3(b)). An alternative configuration providing generally the same effect is a connecting structure having an X-shaped configuration. In any event, the shape and spring constant of the connecting structure 74 can be determined by finite-element analysis using a material constant of the connecting structure 74 such as Young's modulus of elasticity. The edges of the connecting structure 74 are defined by through-holes 75a, 75b and edges of adjacent membrane structures.

SECOND REPRESENTATIVE EMBODIMENT

Figure 4:
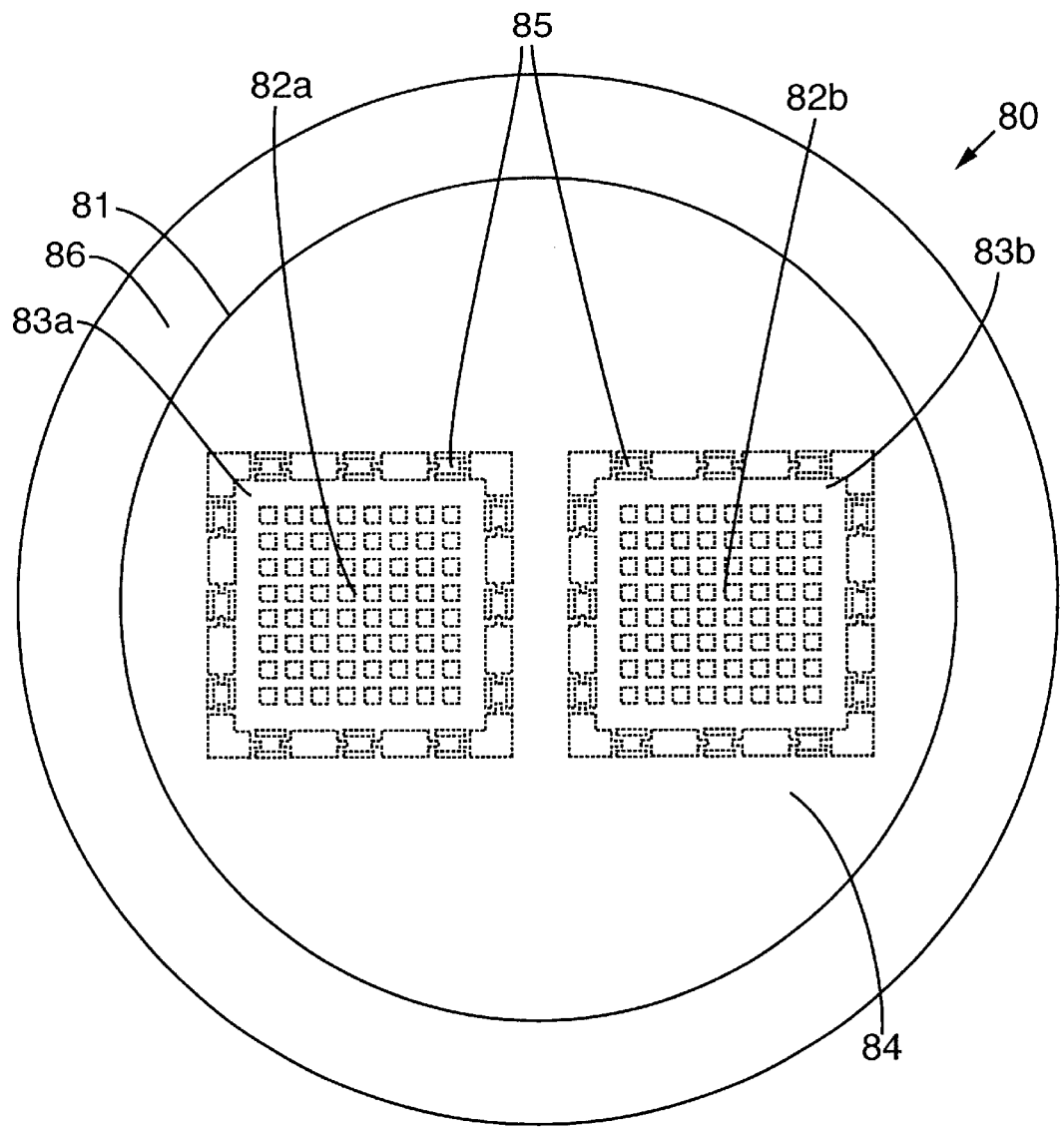
FIG. 4 is a plan view of a reticle according to a second representative embodiment.

A reticle assembly 80 according to this embodiment is shown in FIG. 4, and is especially suitable in instances in which multiple (two in this embodiment) pattern-defining regions are provided on the same reticle substrate. More specifically, the reticle assembly 80 is a stencil reticle 81 comprising two separate pattern-defining regions 82a, 82b. The pattern-defining regions are surrounded by respective inner supporting parts 83a, 83b. The inner supporting parts 83a, 83b are connected to an outer supporting part 84 by multiple connecting structures 85. Finally, the stencil reticle 81 is connected to a peripheral frame 86.

THIRD REPRESENTATIVE EMBODIMENT

Figure 5A:
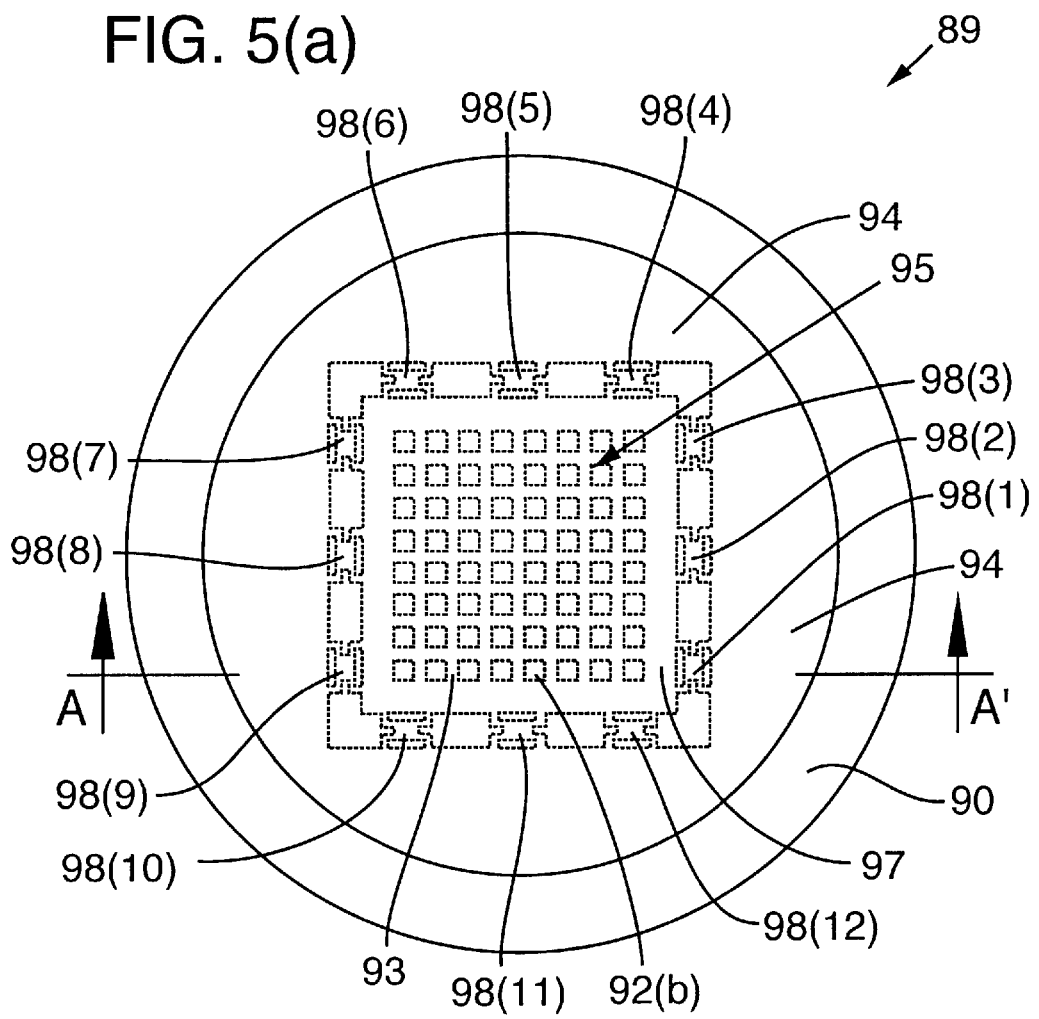
FIGS. 5(a)–5(b) are a plan view and elevational section (along the line A–A'), respectively, showing certain features of a reticle according to a third representative embodiment.
Figure 5B:
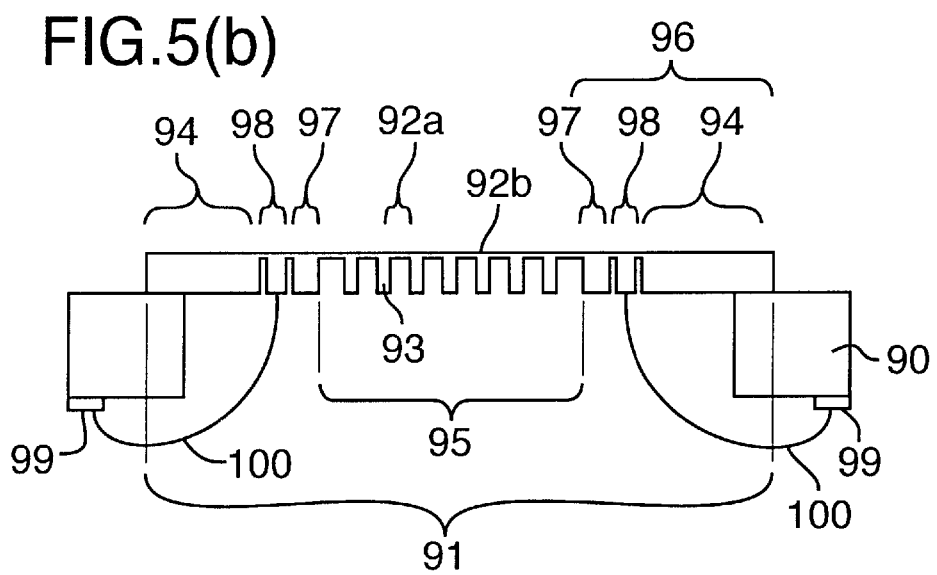

A reticle 89 according to this embodiment is shown in FIGS. 5(a)–5(b), and comprises a stencil-reticle portion 91 and a peripheral frame 90. The stencil-reticle portion 91 comprises an outer supporting part 94, an inner supporting part 97 (collectively constituting a support part 96), a pattern-defining region 95, and multiple drivable (electrically actuatable) connecting structures 98(1)–98(12) for connecting together the outer supporting part 94 and the inner supporting part 97. The pattern-defining region 95 is divided into multiple subfields 92a separated from one another by support struts 93. Each subfield 92a includes a respective portion of the reticle membrane 92b. An obverse surface of the peripheral frame 90 is attached circumferentially to the stencil-reticle portion 91.

Each of the drivable connecting structures 98 is electrically actuatable. To such end, pads 99 are provided on the reverse surface of the peripheral frame, wherein wiring 100 connects each pad 99 to a respective connecting structure 90. In general, and by way of example, the wiring 100 has a diameter of 30 μm, and each pad 99 measures 30 μm square. The wiring 100 is bonded to the pads 99 and connecting structures 98 using conventional semiconductor fabrication techniques. Further details of a drivable connecting structure 98 are shown in FIGS. 6(a)–6(b). Each connecting structure 98 comprises a first flexible membrane member 101 connected to the outer supporting part 94, a second flexible membrane member 102 connected to the inner supporting part 97, and an electrically insulating member 103 situated between the first flexible membrane member 101 and the second flexible membrane member 102. The first and second flexible membrane members 101, 102 are electrically conductive and can be formed by doping impurities into intrinsic silicon. As noted above, in this embodiment, twelve (by way of example) drivable connecting structures 98(1)–98(12) are provided. Since each connecting structure 98 has respective first and second flexible membrane members 101, 102 and a respective insulating member 103, the respective reference numbers for the first flexible membrane members are 101(1)–101(12), the respective reference numbers for the second flexible membrane members are 102(1)–102(12), and the respective reference numbers for the insulating members are 103(1)–103(12).

The first flexible membrane member 101(1) of the first connecting structure 98(1), connected to the outer supporting part 94, is part of a respective conductive region 104 provided in the outer supporting part 94. The second flexible membrane member 102(1) of the first connecting structure 98(1), connected to the inner supporting part 97, is part of a conductive region 105 provided in the inner supporting part 97. The conductive regions 104, 105 can be formed by doping impurities into intrinsic silicon. The conductive regions 101, 104 desirably are made of the same material, and the conductive regions 102, 105 desirably are made of the same material.

Figure 7:
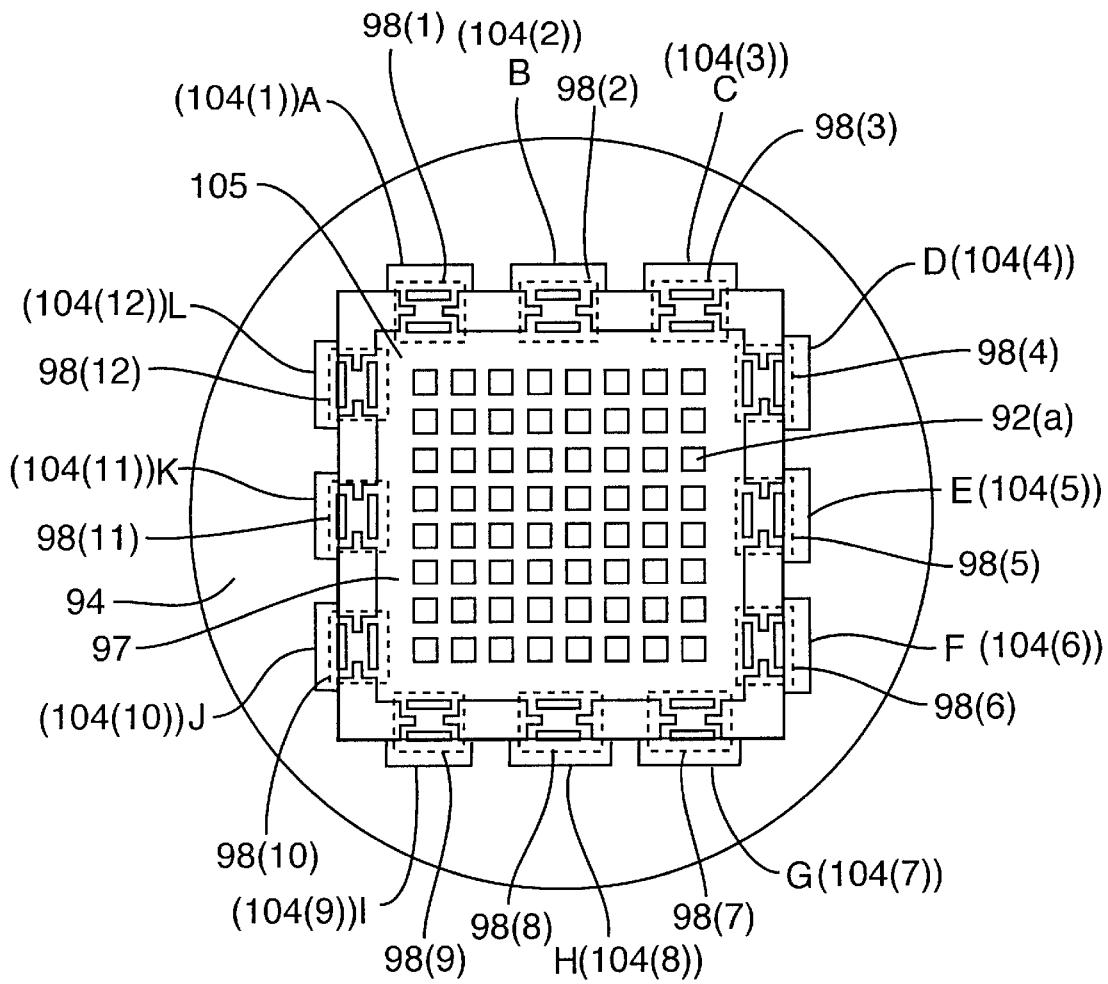
FIG. 7 is a plan view showing the arrangement of the drivable connecting structures of the reticle according to the third representative embodiment.

The arrangements of connecting structures 98(1)–98(12) in this embodiment, and associated conductive regions 104(1)–104(12), are shown in FIG. 7. Each of the conductive regions 104(1)–104(12) is separate from one another. Connected to each of the conductive regions 104(1)–104(12) is a respective wire 100(1)–100(12) (not shown, but see FIGS. 6(a)–6(b)). The wires 100(1)–100(12) deliver respective electrical driving signals (from a power source, not shown) to the conductive regions 104(a)–104(12). FIG. 7 also shows the conductive region 105. The conductive region 105 can be the inner support part 97 or a portion of the inner support part 97.

As shown in FIG. 6(b), upon application of different respective electrical voltages to each conductive region 104, an electrostatic-charge attraction is generated between the conductive regions 104, 105, respectively. Specifically, the conductive region 105 is floated electrically, and the conductive regions 104 receive respective applied voltages. As a result, the conductive regions 104, 105 move toward each other (arrows 106), causing the flexible membrane members 101, 102 to flex. The attractive force is a function of the applied voltage, the area of the conductive region (relative to the opposing conductive region), and the distance between opposing conductive regions.

For the following discussion, the conductive regions 104(1)–104(12) are denoted A–L, respectively, as indicated in FIG. 7. FIGS. 8(a)–8(j) depict respective modes of motion of the inner supporting part (and pattern-defining region 95) whenever certain respective groups of conductive regions A–L are energized (arranged as shown: in FIG. 7). Selective energization of the conductive regions 104(1)–104(12) is performed by selectively applying voltages to them. Before applying the voltages, deformation of the reticle is determined. For example, if the adjacent region of the connecting structure A is deformed (i.e., smaller than required), then voltage is applied to the conductive region 104(1). From measurements of such deformation and calculations of the relationship, between applied voltage and deformation by attractive force, the required voltage to correct the deformation by attractive force is determined. In general, applied voltages range from 0–140 KV at an accuracy of 140 mV. For example, at 140 KV, 1 μm linear deformation or 3 mdeg rotational deformation can be achieved.

For example, whenever a voltage is applied to each of the conductive regions A,D,G, and J, the inner supporting part 97 (and thus the pattern-defining region 95) is rotated to a limited extent in a clockwise direction in the figure (FIG. 8(a)). Similarly, whenever a voltage is applied to each of the conductive regions C, F, I, and L, the inner supporting part 97 (and thus the pattern-defining region 95) is rotated to a limited extent in a counterclockwise in the figure (FIG. 8(b)). If the rotation is symmetrical, then no deformation of the pattern-defining region 95 occurs. However, if this rotation is not symmetrical, then some deformation of the pattern-defining region 95 can occur, which can be corrected by selective energization of other conductive regions as described below. Referring to FIG. 4, if the regions 83a and 83b are rotated in opposite directions, then electrically actuated corrective rotations as described above can be used to correct the rotations.

The achievable angle of rotation in each of FIGS. 8(a)–8(b) is approximately 3 μdeg to 3 mdeg. (The rotation of 3 mdeg is achieved at about 140 KV of applied voltage.) The degree of rotation is controllable to with an accuracy of 1 μdeg by appropriately controlling the applied voltage.

To continue, whenever a voltage is applied to each of the conductive regions A, B, and C, the inner supporting part 97 (and thus the pattern-defining region 95) moves upward in the figure (FIG. 8(c)). Similarly, whenever a voltage is applied to each of the conductive regions G, H, and I, the inner supporting part 97 (and thus the pattern-defining region 95) moves downward in the figure (FIG. 8(d)). Similarly, whenever a voltage is applied to each of the conductive regions I, K, and L, the inner supporting part 97 (and thus the pattern-defining region 95) moves to the left in the figure (FIG. 8(e)). Similarly, whenever a voltage is applied to each of the conductive regions D, E, and F, the inner supporting part 97 (and thus the pattern-defining region 95) to the right in the figure of the drawing (FIG. 8(f)). In each of these instances, the displacement distance of the inner supporting part 97 is 1 nm to 1 μm. The accuracy of this movement can be controlled to an accuracy of 1 nm or less. Again, by way of example, the range of applied voltage is 0–140 KV, with an accuracy of 140 mV. At 140 KV, a deformation of about 1.4 μm is obtainable.

To continue, whenever a voltage is applied to each of the conductive regions G, H, I, J, K, and L, the inner supporting part 97 (and thus the pattern-defining region 95) moves diagonally downward to the left in the figure (FIG. 8(g)). Similarly, whenever a voltage is applied to each of the conductive regions D, E, F, G, H, and I, the inner supporting part 97 (and thus the pattern-defining region 95) moves diagonally downward to the right in the figure (FIG. 8(h)). Similarly, whenever a voltage is applied to each of the conductive regions A, B, C, D, E, and F, the inner supporting part 97 (and thus the pattern-defining region 95) moves diagonally upward to the right in the figure (FIG. 8(i)). Similarly, whenever a voltage is applied to each of the conductive regions A, B, C, J, K, and L, the inner supporting part 97 (and thus the pattern-defining region 95) moves diagonally upward to the left in the figure (FIG. 8(j)). The displacement distance in each instance of the inner supporting part 97 is 1.4 nm to 1.4 μm. The accuracy of motion can be controlled to within 1.4 nm.

Methods for fabricating a reticle according to this embodiment are now described with reference to FIGS. 9(a)–9(b), 10(a)–10(b), and 11(a)–11(d).

An SOI (silicon on insulator) reticle substrate 110 is prepared that comprises a silicon layer 113, a silicon oxide layer 112, and a base layer 111 of silicon. The SOI reticle substrate 110 is fabricated by conventional techniques as summarized above (regarding FIG. 2(a)). Conductive regions 114(1)–114(12) and 115 are then formed on (and extending into the thickness dimension of) the silicon base layer 111 (FIG. 9(a)).

The conductive regions 114(1)–114(12) and 115 are formed by doping impurities (e.g., P and/or B) into predetermined regions of the base layer 111 using ion injection or thermal diffusion. The predetermined regions are defined by using a suitable mask (not shown) having openings corresponding to the desired locations.

Figure 9A:
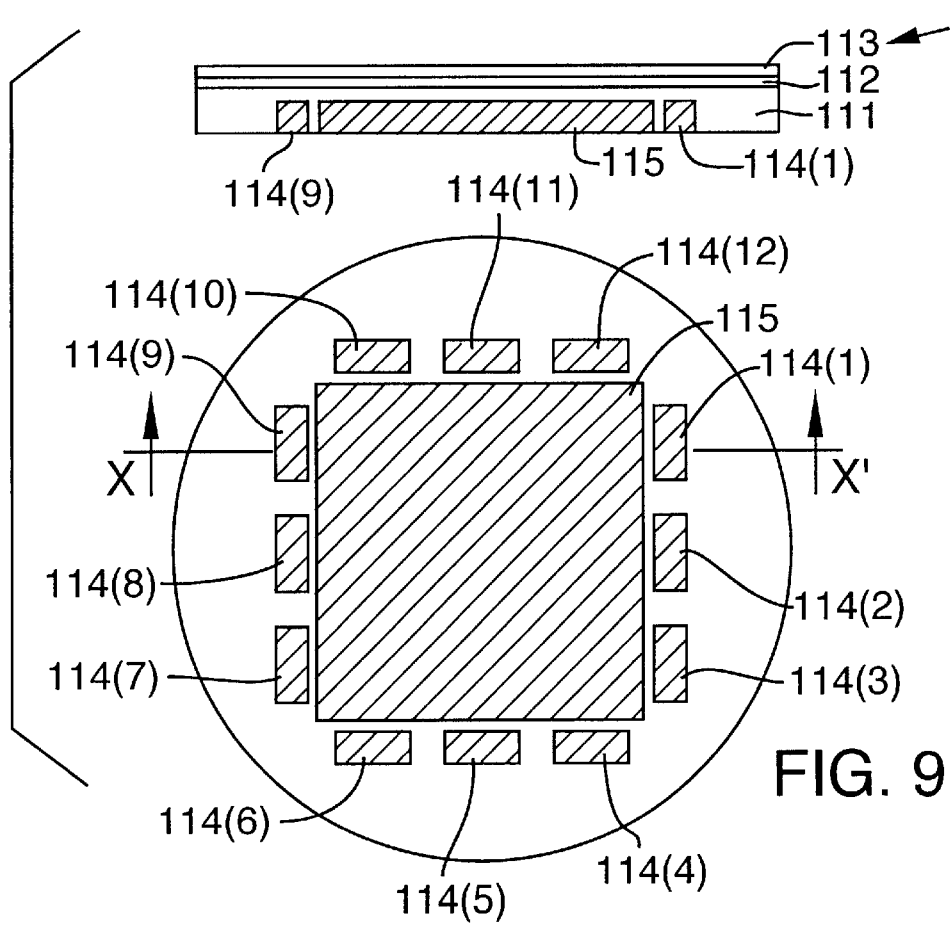
FIGS. 9(a)–9(b) depict the results of certain respective steps in the manufacture of a reticle according to the third representative embodiment.
Figure 9B:
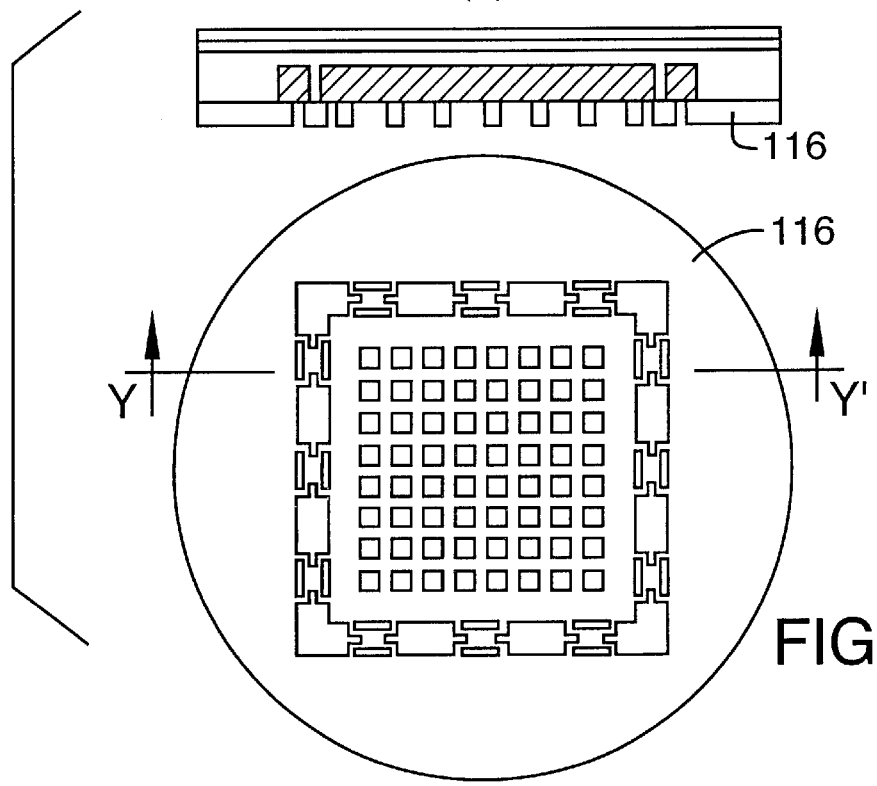
Figure 10B:
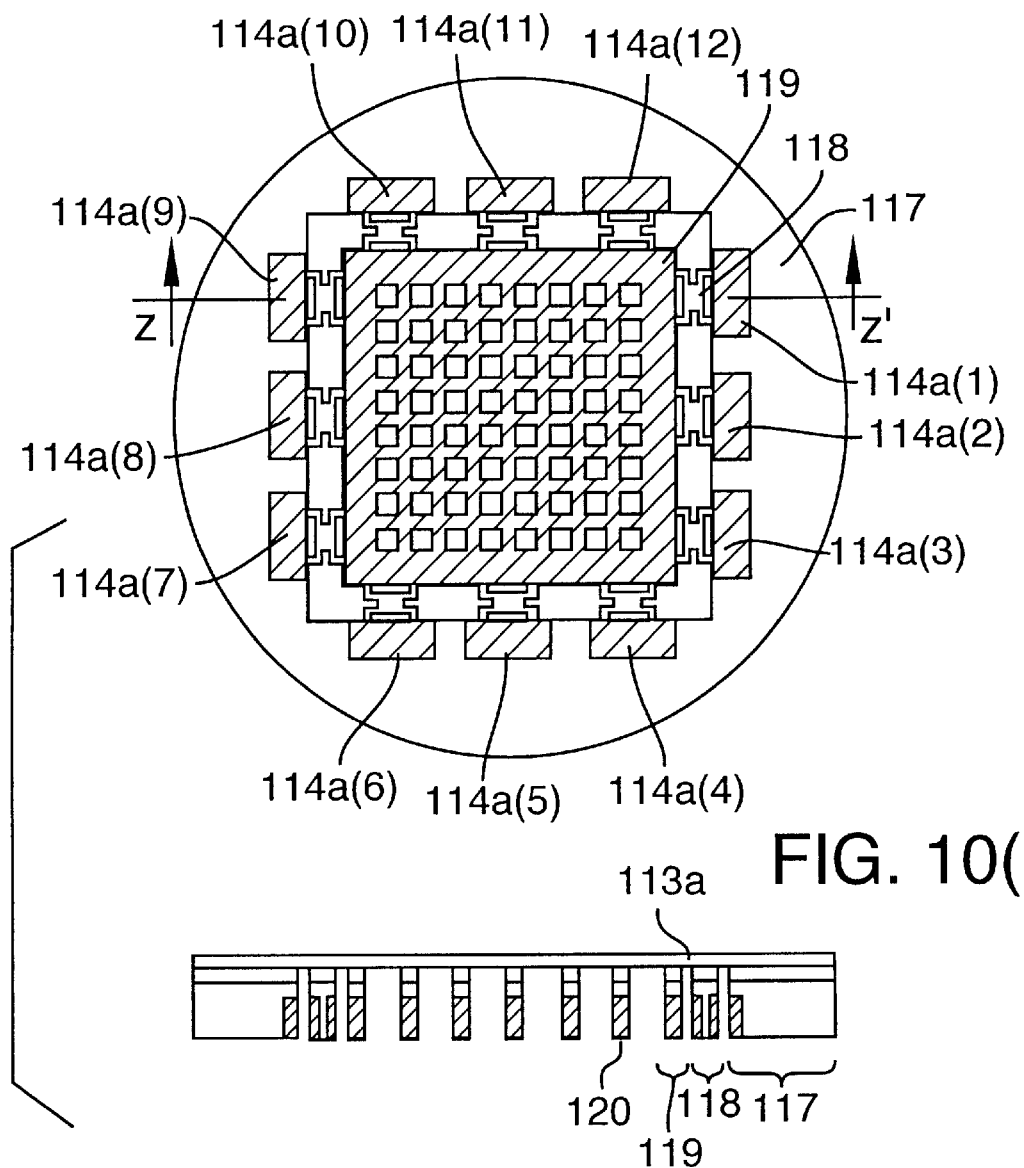
FIGS. 10(a)–10(b) depict the results of certain respective steps, continued from FIGS. 9(a)–9(b), in the manufacture of a reticle according to the third representative embodiment.
Figure 10A:
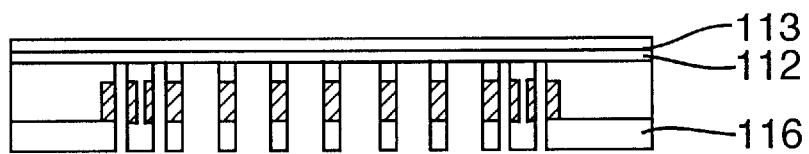

Next, an etching mask 116 defining a predetermined pattern is applied to the under-surface (in the figure) (FIG. 9(b)) using conventional techniques. Using the etching mask 116 as an etching guide, anisotropic etching is performed of the conductive regions 114(1)–114(12) and 115 to the silicon oxide layer 112 (FIG. 10(a)). After etching, the remaining mask 116 is removed. During the anisotropic etching, the base layer 111 is etched to the silicon oxide layer 112 due to substantially different etch rates of silicon versus silicon oxide. The silicon oxide 112 exposed in the trenches formed by etching is removed using hydrofluoric acid, thereby forming the outer supporting part 117, the drivable connecting structures 118, the inner supporting part 119, and support struts 120 (FIG. 10(b)). The silicon layer 113 becomes a silicon reticle membrane 113a in the resulting reticle blank (FIG. 10(b)).

Figure 11A:
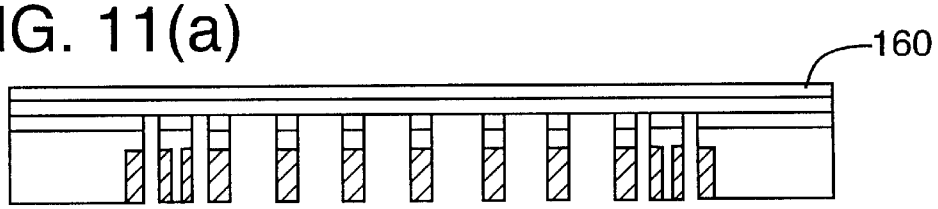
FIGS. 11(a)–11(d) depict the results of certain steps, continued from FIGS. 10(a)–10(b), in the manufacture of a reticle according to the third representative embodiment. Each of FIGS. 11(a)–11(d) provides a respective elevational section.
Figure 11B:
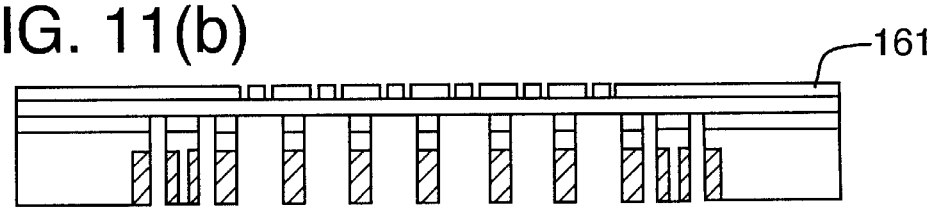

A layer of resist 160 is coated on the reticle membrane 113a (FIG. 11(a)). The resist is patterned microlithographically with the desired reticle pattern. The resist is cured and baked to form an etching mask 161 (FIG. 11(b)). The reticle blank is etched according to the etching mask 161 to produce a stencil reticle 121 (FIG. 11(c)).

The process described above is a so-called "back-etch preceding process" in which the stencil-reticle pattern is formed in the reticle membrane after completing formation of the reticle blank, an alternative process that can be used is the so-called "back-etch successive process" in which the stencil-reticle pattern is formed in the membrane before completing formation of the reticle blank. I.e., in the back-etch successive process, the silicon base layer is etched after the reticle pattern is formed on the silicon layer 113.

Figure 11C:
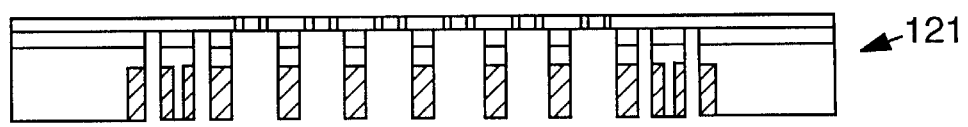

The stencil reticle 121 of FIG. 11(c) is attached to a peripheral frame 162 by eutectic or anodic welding, use of an adhesive, or use of mechanical fasteners. The peripheral frame 162 is attached to the outer supporting part 117 (FIG. 11(d)). The peripheral frame 162 desirably is made separately, before attachment to the outer supporting part 117, from a unit of silicon, glass, or ceramic. The peripheral frame 162 desirably has an inside diameter that is smaller than the outside diameter of the outer supporting part 117 and larger than the inside diameter of the outer supporting part 117, and an outside diameter that is larger than the outside diameter of the outer supporting part 117. The peripheral frame 162 has a thickness desirably in the range of 5 to 10 mm (the thickness is a function of the radius of the peripheral frame 162). The profile of the inside diameter of the peripheral frame 162 is not limited to circular; for example, it alternatively can be polygonal.

Eutectic bonding of the peripheral frame 162 to the outer supporting part 117 is performed as follows: A gold layer (having a thickness of 200 to 500 nm) is layered in a predetermined region(s) on the peripheral frame 162 that will be bonded to the outer supporting part 117. The gold layer can be formed by a conventional vacuum evaporation technique. Desirably, the surface of the peripheral frame 162 on which the gold layer is formed is mirror-polished (before applying the gold layer) to achieve maximal adhesion. Gold-silicon eutectic bonds are formed by heating in an electric furnace at a temperature of 400° C. for 5 hours.

The gold-silicon eutectic bond need not be formed entirely around the periphery of the outer supporting part 117. Alternatively, eutectic "spot welds" can be formed, each having an area of several square millimeters. Spot welds can be formed by forming a ring-shaped gold layer, as described above, and then partially removing portions of the gold layer by etching or the like. Alternatively, the gold can be applied selectively to desired locations using a mask or the like. The number of spot welds and the area of each spot weld are determined by the warp tolerance of the reticle and the desired strength of the welds. After forming the gold spots, the peripheral frame 162 and outer supporting part 17 are brought into contact with each other and heated, such as in an electric furnace at 400° C. for 5 hours.

The reticle pattern can be formed in the reticle membrane after attaching the peripheral frame 162.

Figure 11D:
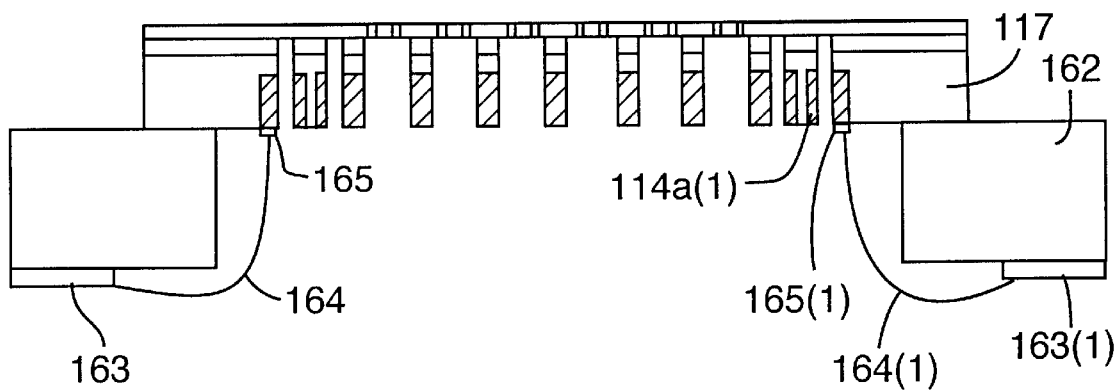

Wire-connecting pads 163 made of an electrically conductive material (e.g., gold) can be applied to the peripheral frame 162 before or after the peripheral frame 162 is bonded to the outer supporting part 117. The wire-connecting pads 163 are used for connecting respective wires 164 connected to respective conductive regions 114(1)–114(12) via respective wire-connecting pads 165. For example, a wire 164(1) connects the wire-connecting pad 163(1) to a corresponding wire-connecting pad 165(1) associated with the conductive region 114(1), as shown in FIG. 11(d). Because the conductive regions 114(1)–114(12) are doped silicon, wire connections as described above facilitate electrical energization of the respective conductive regions.

FOURTH REPRESENTATIVE EMBODIMENT

Figure 12:
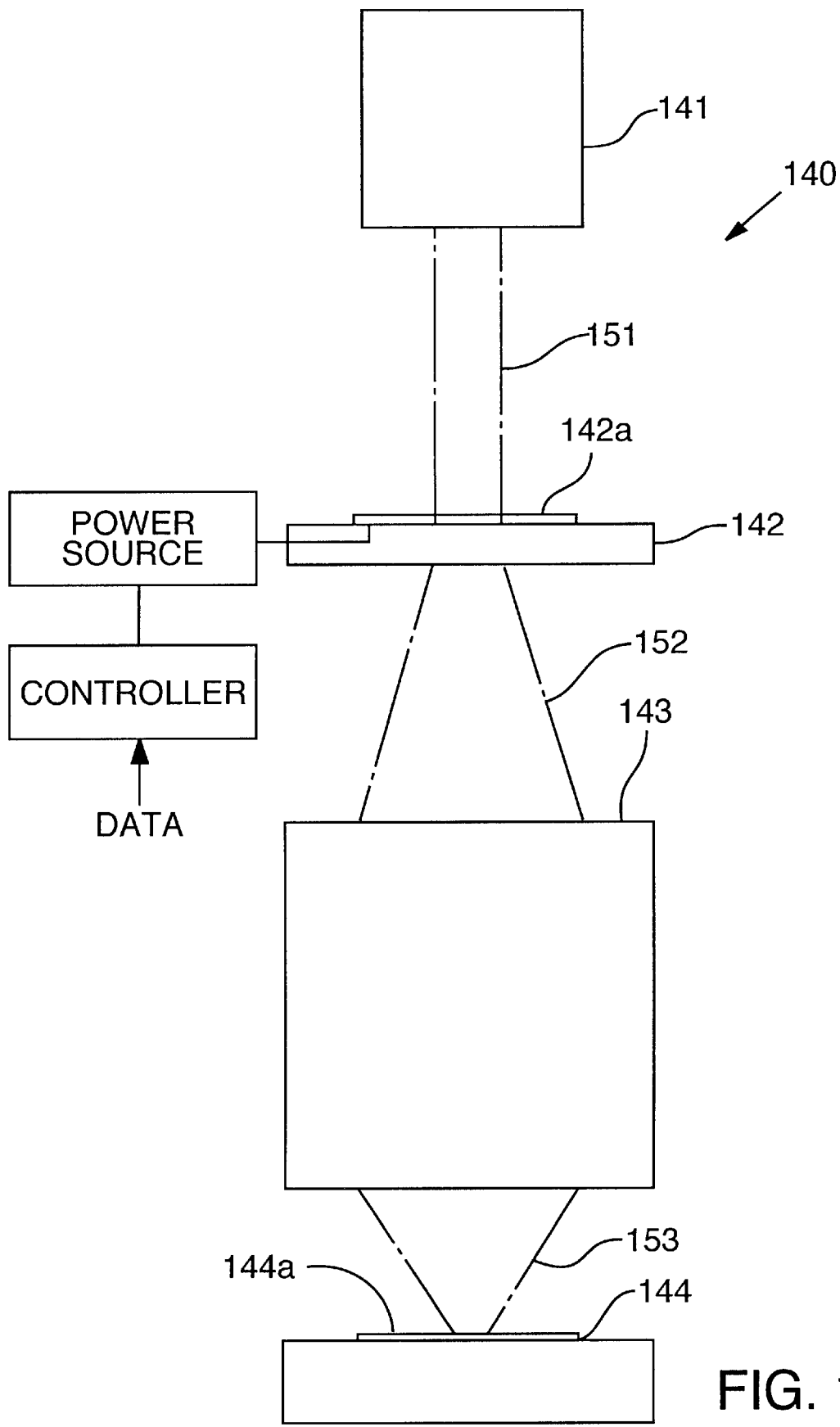
FIG. 12 is a schematic elevational diagram of a charged-particle-beam microlithography apparatus according to a fourth representative embodiment of the invention.

An electron-beam microlithography apparatus 140 according to this embodiment is shown in FIG. 12. The apparatus 140 comprises an illumination-optical system 141 that directs an electron beam ("illumination beam" 151) from an electron gun (not shown) to a reticle 142a. The apparatus also comprises a reticle stage 142 for holding the reticle as described above. Downstream of the reticle stage 142 are a projection-optical system 143 and a substrate stage 144 for holding a suitable substrate 144a (e.g., semiconductor wafer) for exposure with the pattern defined on the reticle 142a. The projection-optical system 143 receives portions of the illumination beam (i.e., a "patterned beam" 152) passing through the illuminated region of the reticle and focuses the beam (beam 153) on a corresponding region of the substrate 144a.

Any warp of the reticle 142a (i.e., warp of pattern elements defined by the reticle) can be measured at time of using the reticle in the microlithography apparatus 140. Warp can be measured using, for example, a Nikon optical-wave-coherence-type coordinate-measuring tool.

After measuring reticle warp, the reticle is mounted on the reticle stage 142. If any warp was detected, selective energization of the conductive regions 114 is made (FIGS. 8(a)–8(j)) as required to achieve countervailing motion of the reticle, thereby canceling the warp. The necessary electrical connections to the reticle are made via connectors provided in the reticle stage. The connectors in the reticle stage are connected to a power source (FIG. 12) that is connected to a processor (e.g., the central processor of the microlithography apparatus). The processor supplies appropriate commands to the power source, based on warp-data input to the processor. The processor calculates voltages necessary to cancel the deformation of the reticle. Warp correction can be made in this manner within a tolerance of 5 nm to 20 nm.

After making the warp correction, the illumination beam 151 passing through the illumination-optical system 141 is directed at the reticle mounted on the reticle stage 142. The resulting patterned beam 152 is directed to the substrate by the projection-optical system 143.

The substrate can be a silicon wafer, for example, coated with a suitable resist that can be exposed in an image-forming way by the patterned beam 153. The substrate typically is imaged multiple times with different patterns (with intervening process steps) to form a many-layered semiconductor device on the wafer.

FIFTH REPRESENTATIVE EMBODIMENT

Figure 13:
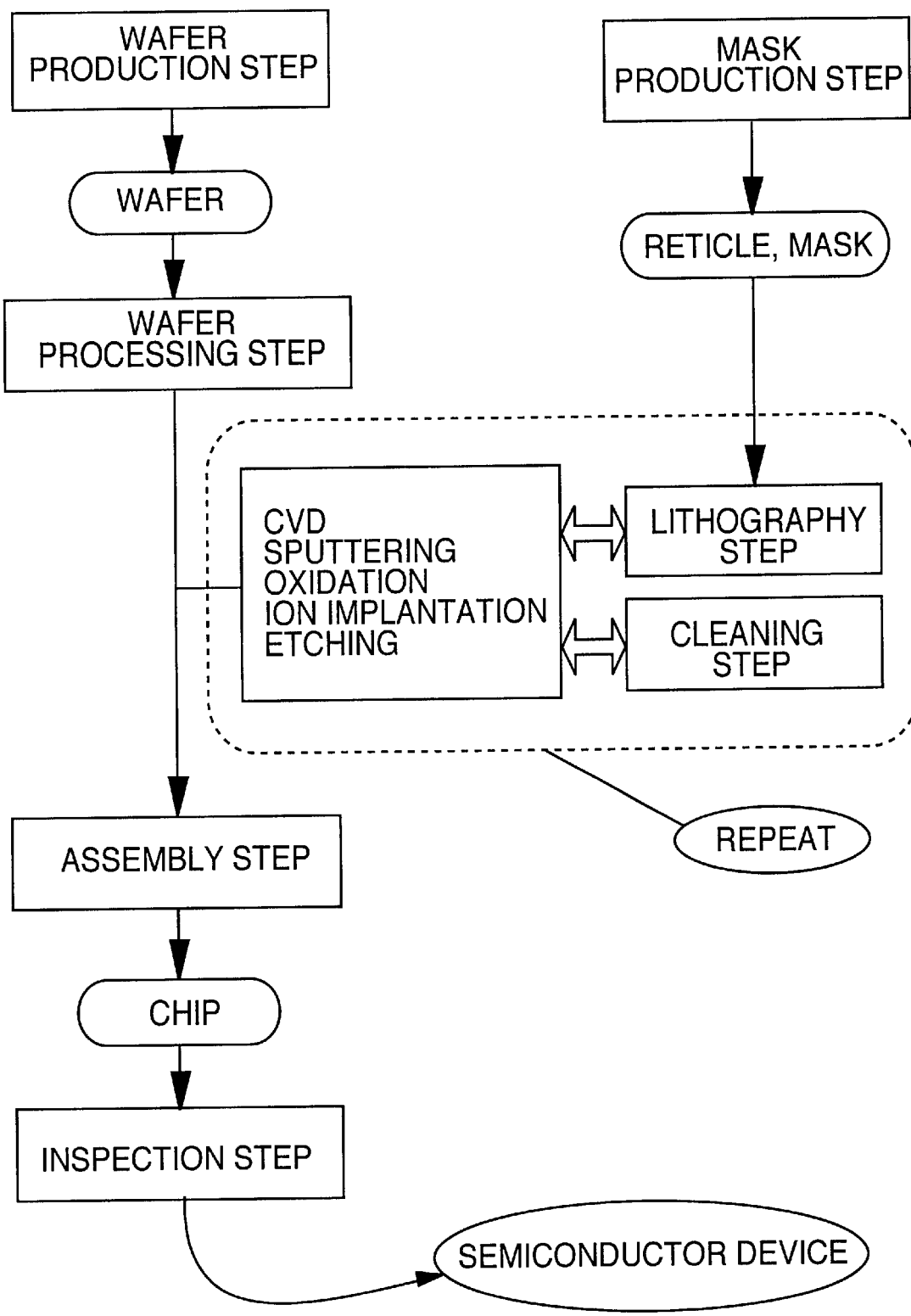
FIG. 13 is a process flowchart for manufacturing a semiconductor device, wherein the process includes a microlithography method utilizing a reticle according to the invention.

FIG. 13 is a flowchart of an exemplary semiconductor fabrication method to which reticles according to the invention readily can be applied. The fabrication method generally comprises the main steps of wafer production (wafer preparation), reticle production (reticle preparation), wafer processing, device assembly, and inspection. Each step usually comprises several sub-steps.

Among the main steps, wafer processing is key to achieving the smallest feature sizes (critical dimensions) and best inter-layer registration. In the wafer-processing step, multiple circuit patterns are successively layered atop one another on the wafer, wherein the formation of each layer typically involves multiple sub-steps. Usually, many operative semiconductor devices are produced on each wafer.

Typical wafer-processing steps include: (1) thin-film formation involving formation of a dielectric layer for electrical insulation or a metal layer for connecting wires; (2) microlithography to form a resist pattern for selective processing of the thin film or the substrate itself; (3) etching or analogous step to etch the thin film or substrate according to the resist pattern, or doping as required to implant ions or impurities into the thin film or substrate according to the resist pattern; (4) resist stripping to remove the resist from the wafer; and (5) chip inspection. Wafer processing is repeated as required (typically many times) to fabricate the desired semiconductor chips on the wafer.

Figure 14:
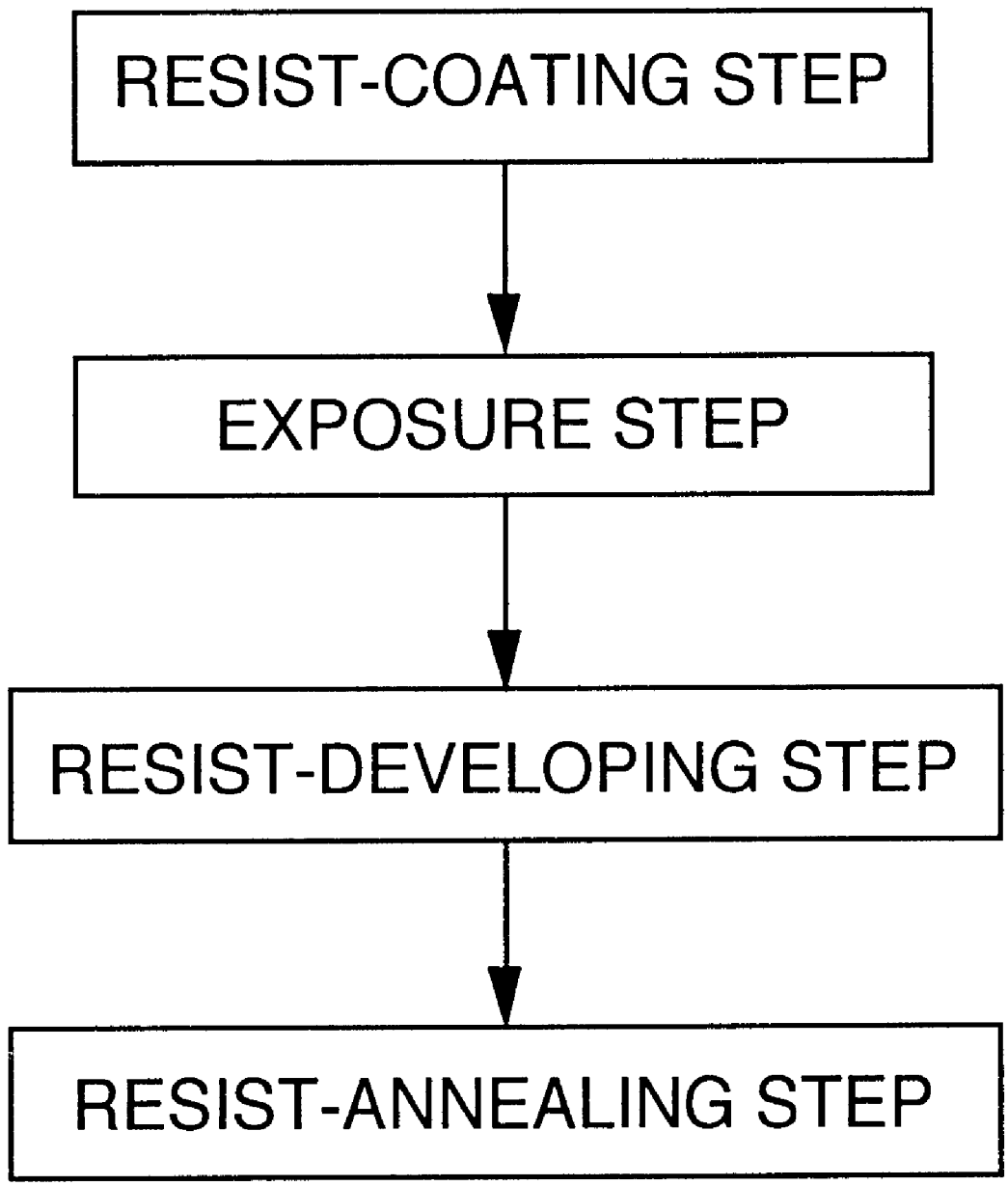
FIG. 14 is a process flowchart for performing a microlithography method utilizing a reticle according to the invention.
Figure 15A:
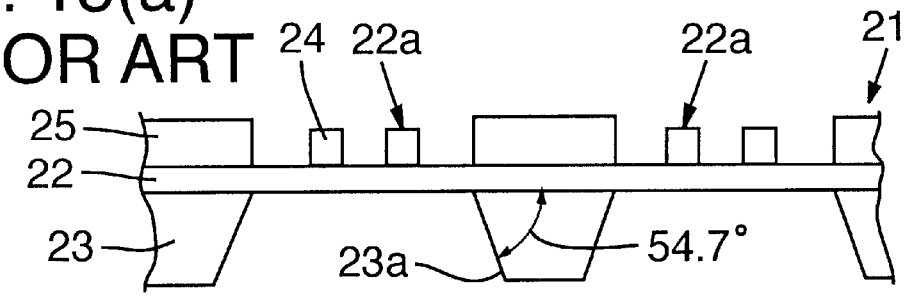
FIG. 15(a) is a schematic elevational view of certain aspects of a conventional scattering-membrane reticle.
Figure 15B:
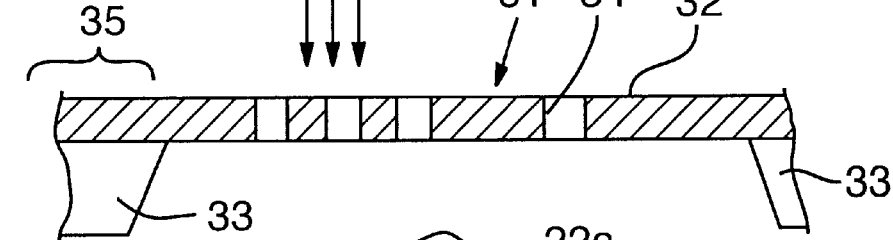
FIG. 15(b) is a schematic elevational view of certain aspects of a conventional scattering-stencil reticle.
Figure 15C:
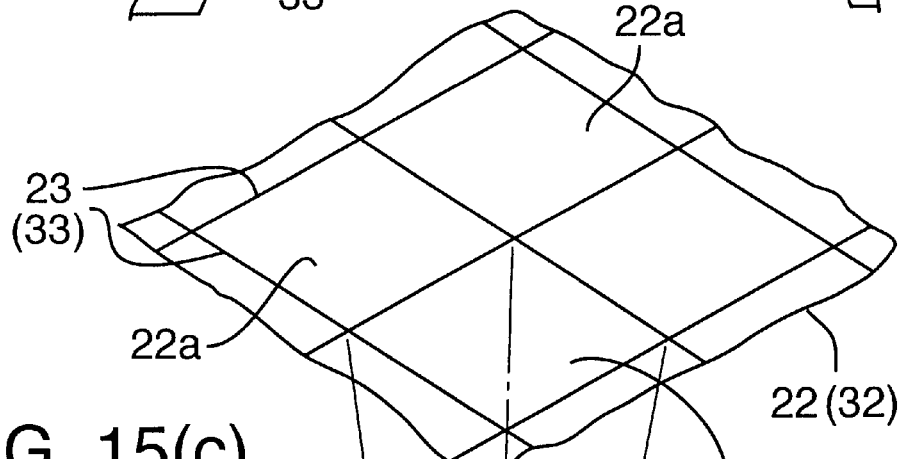
FIG. 15(c) is a schematic oblique view of certain aspects of conventional microlithographic transfer of a reduced image from a reticle to a substrate using a charged particle beam.
Figure 16B:
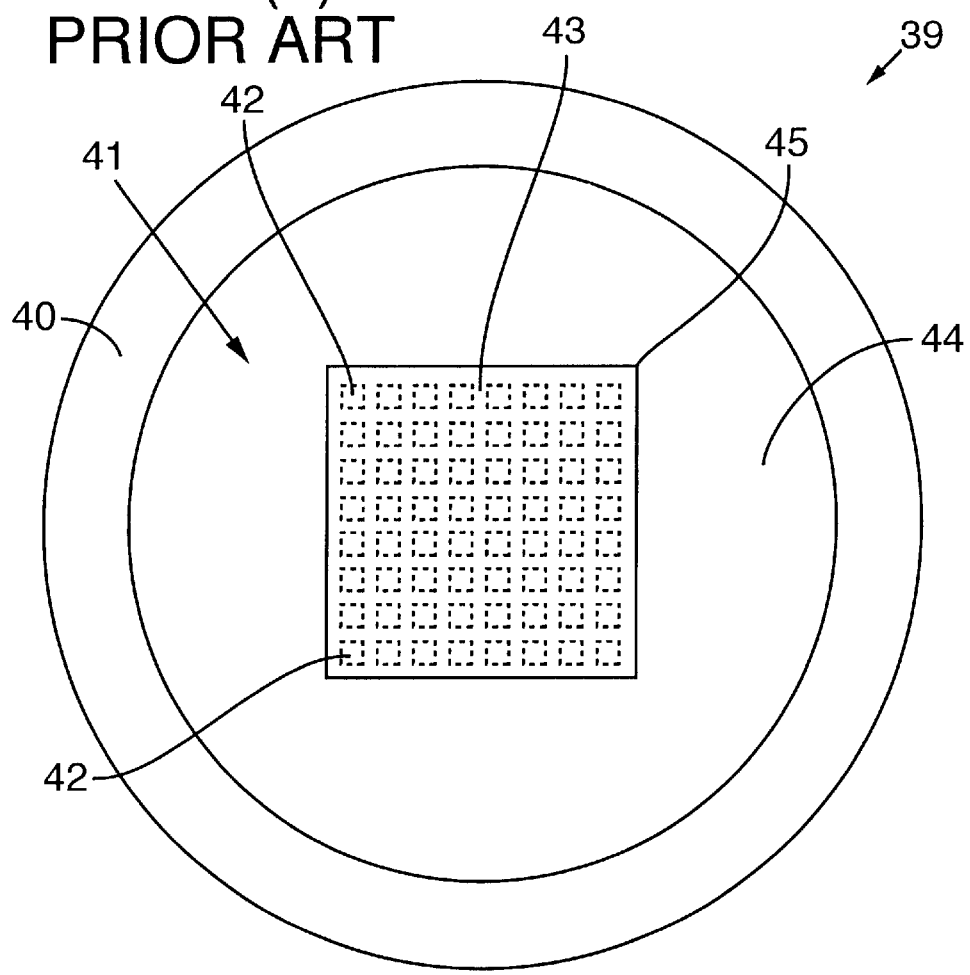
Figure 16B:
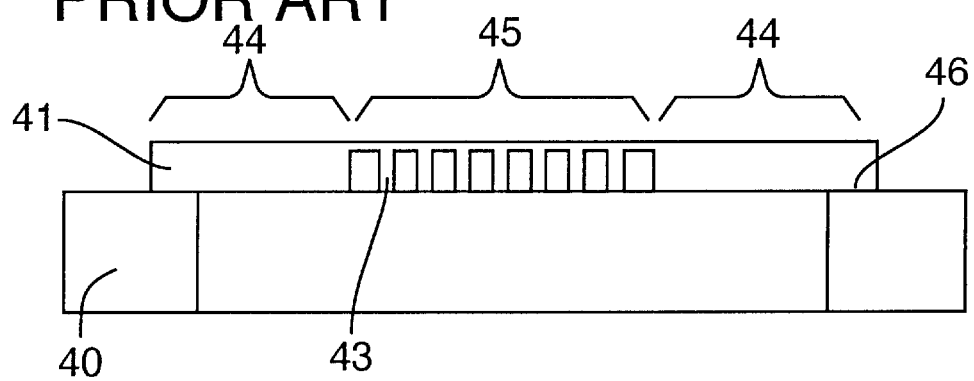

FIG. 14 provides a flow chart of typical steps performed in microlithography, which is a principal step in wafer processing. The microlithography, step typically includes: (1) resist-coating step, wherein a suitable resist is coated on the wafer substrate (which can include a circuit element formed in a previous wafer-processing step); (2) exposure step, to expose the resist with the desired pattern; (3) resist-developing step, to develop the exposed resist; and (4) optional resist-annealing step, to enhance the durability of the resist pattern.

During microlithography, a charged-particle illumination beam is irradiated onto a reticle made according to the invention. The portion of the illumination beam passing through the irradiated region on the reticle (now termed the "patterned beam") is projected on the substrate (wafer) by a projection-optical system, thereby exposing a corresponding region on the substrate. As discussed above, the reticle is divided into multiple subfields, and images of the subfields are formed on the substrate in such a way that the images are stitched together. The reticle is divided due to, inter alia, the difficulty of providing a projection-optical system having an optical field sufficiently large to expose an entire reticle pattern in one shot without excessive aberrations. Also as discussed above, the subfields on the reticle are separated from one another by support struts that add rigidity and strength to the reticle. To obtain an image of the entire pattern on the substrate, the reticle and substrate are synchronously moved relative to each other during exposure. Further details of this exposure scheme are set forth in Japanese Kôkai Patent Document No. Hei 9-283405.

Reticles and microlithographic methods according to the invention reduce the effects of reticle warp, thereby reducing semiconductor fabrication costs. Providing a reticle with support structures as described above can be performed at the same time as forming the support struts; hence, reticles according to the invention can be produced with no increase in reticle production time over conventional reticles.

In any event, reducing reticle warp also results in less pattern warp as projected onto the substrate. Certain embodiments within the scope of the invention permit reduction of reticle warp immediately before using the reticle for making a microlithographic exposure, allowing greater accuracy of pattern transfer.

Whereas the invention has been described in connection with multiple representative embodiments, it will be apparent that the invention is not limited to those embodiments. On the contrary, the invention is intended to encompass all modifications, alternatives, and equivalents as may be included within the spirit and scope of the invention, as defined by the appended claims.

What is claimed is:

1. A reticle for charged-particle-beam (CPB) microlithography, comprising a reticle portion, the reticle portion comprising:

a pattern-defining region comprising multiple subfields separated from one another by support struts, in which struts no pattern elements are defined, and each subfield defining a respective portion of a pattern defined by the reticle;

an inner supporting part peripherally attached to the pattern-defining region, the inner supporting part being configured so as to integrally support the pattern-defining region; and an outer supporting part surrounding the inner supporting part and being connected to the inner supporting part by multiple connecting structures each having a spring characteristic, the outer supporting part being configured so as to peripherally support the inner supporting part and pattern-defining region.

2. The reticle of claim 1, wherein the pattern-defining region is configured as a stencil reticle in which pattern elements are defined as respective voids in a CPB-scattering reticle membrane.

3. The reticle of claim 1, wherein the pattern-defining region is configured as a scattering-membrane reticle in which pattern elements are defined as respective spaces between CPB-scattering bodies situated on a CPB-transmissive reticle membrane.

4. The reticle of claim 1, wherein:

each connecting structure has an H-shaped configuration having two pairs of H-ends; and a first pair of H-ends is connected to the inner supporting part and a second pair of H-ends is connected to the outer supporting part.

5. The reticle of claim 1, wherein:

each connecting structure has an X-shaped configuration having two pairs of X-ends; and a first pair of X-ends is connected to the inner supporting part and a second pair of X-ends is connected to the outer supporting part.

6. The reticle of claim 1, comprising a number (n) of connecting structures each satisfying a relationship $nK_f=K_s/\beta$, wherein $K_s$ is an in-plane elastomeric constant of the reticle portion, $\beta$ is a connection-relaxation coefficient of the connecting structure, and $K_f$ is a spring constant of the connecting structure.

7. The reticle of claim 1, further comprising a peripheral frame peripherally attached to the reticle portion.

8. A reticle for charged-particle-beam (CPB) microlithography, comprising a reticle portion, the reticle portion comprising:

a pattern-defining region comprising multiple subfields separated from one another by support struts, each subfield defining a respective portion of a pattern defined by the reticle;

an inner supporting part peripherally attached to the pattern-defining region, the inner supporting part being configured so as to integrally support the pattern-defining region;

an outer supporting part peripherally surrounding: the inner supporting part;

multiple connecting structures connecting the inner supporting part to the outer supporting part, each connecting structure comprising a first conductive region situated on the inner supporting part, at least the first conductive regions being selectively energizable electrically so as to selectively cause the respective second conductive regions to move relative to the respective first conductive regions, thereby displacing the pattern-defining region so as to at least partially cancel a warp:of the pattern-defining region.

9. The reticle of claim 8, wherein, in each connecting structure, the first and second conductive regions exhibit electrostatic attraction with respect to each other under appropriate conditions of electrical energization of at least the respective first conductive region.

10. The reticle of claim 8, further comprising a peripheral frame peripherally attached to the outer supporting part.

11. The reticle of claim 10, wherein the peripheral frame comprises a conductive pad from which a wiring connection is made to a respective first conductive region.

12. The reticle of claim 8, wherein:

each of the first conductive regions comprises a first flexible membrane member connected to the outer supporting part;

each of the second conductive regions comprises a second flexible membrane member connected to the inner supporting part; and each connecting structure further comprises an insulating member situated between the respective first and second flexible membrane members.

13. A charged-particle-beam (CPB) microlithography apparatus, comprising:

an illumination-optical system situated and configured to irradiate a charged-particle illumination beam onto a selected region of a reticle as recited in claim 8;

a reticle stage situated and configured to (i) hold the reticle as the reticle is being illuminated by the illumination beam, and (ii) selectively energize the conductive regions so as to reduce reticle warp;

a projection-optical system situated and configured to receive a patterned beam, formed by passage of the illumination beam through the reticle and carrying an image of the irradiated region of the reticle, and to focus the image onto a predetermined position on a sensitive substrate; and a substrate stage situated and configured to hold the substrate as the substrate is being exposed by the patterned beam.

14. A method for microlithographically exposing a pattern onto a sensitive substrate using a charged particle beam, comprising:

providing a reticle comprising (i) a pattern-defining region comprising multiple subfields each defining a respective portion of a pattern defined by the reticle, (ii) an inner supporting part peripherally attached to the pattern-defining region and configured so as to integrally support the pattern-defining region, (iii) an outer supporting part peripherally surrounding the inner supporting part, and (iv) multiple connecting structures connecting the inner supporting part to the outer supporting part, each connecting structure comprising a first conductive region situated on the outer supporting part and a second conductive region situated on the inner supporting part;

selectively energizing one or more of at least the first conductive regions electrically so as to selectively cause the respective second conductive regions to move relative to the respective first conductive regions, thereby displacing the pattern-defining region so as to at least partially cancel a warp of the pattern-defining region; and selective irradiating the charged particle beam onto the subfields in an ordered manner to transfer the reticle pattern to the substrate.

15. A semiconductor-fabrication process, comprising the steps of:
   (a) preparing a wafer;
   (b) processing the wafer; and
   (c) assembling devices on the wafer during steps (a) and (b), wherein step (b) comprises a method for microlithographically exposing a pattern, as recited in claim 14.

16. A semiconductor device produced by the method of claim 15.

* * * * *

UNITED STATES PATENT AND TRADEMARK OFFICE
CERTIFICATE OF CORRECTION

PATENT NO. : 6,459,090 B1
DATED : October 1, 2002
INVENTOR(S) : Suzuki

It is certified that error appears in the above-identified patent and that said Letters Patent is hereby corrected as shown below:

Column 4,
Line 19, "Inc" should be -- In --.
Line 57, "a:" should be -- a --.

Column 5,
Line 7, "patter-defining" should be -- pattern-defining --.
Line 64, "least:partially" should be -- least partially --.

Column 7,
Line 42, "silicon.-on-oxide" should be -- silicon-on-oxide --.

Column 10,
Line 18, "104($a$)-104(12)" should be -- 104(1)-104(12) --.
Line 39, "shown:" should be -- shown --.

Column 14,
Line 31, "microlithography," should be -- microlithography --.

Column 16,
Line 3, "surrounding:" should be -- surrounding --.
Line 14, "warp:" should be -- warp --.

Signed and Sealed this

Eleventh Day of November, 2003

JAMES E. ROGAN
*Director of the United States Patent and Trademark Office*